(12) United States Patent
Higuchi et al.

(10) Patent No.: US 12,389,531 B2
(45) Date of Patent: Aug. 12, 2025

(54) CIRCUIT MODULE

(71) Applicant: Murata Manufacturing Co., Ltd., Kyoto-fu (JP)

(72) Inventors: Taro Higuchi, Nagaokakyo (JP); Yoshihiro Imanishi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 269 days.

(21) Appl. No.: 18/179,955

(22) Filed: Mar. 7, 2023

(65) Prior Publication Data

US 2023/0292430 A1    Sep. 14, 2023

(30) Foreign Application Priority Data

Mar. 8, 2022 (JP) ................................ 2022-035452
Jan. 19, 2023 (JP) ................................ 2023-006895

(51) Int. Cl.
*H05K 1/02* (2006.01)
*H05K 5/02* (2006.01)
*H04B 3/54* (2006.01)

(52) U.S. Cl.
CPC ............. *H05K 1/0233* (2013.01); *H05K 5/02* (2013.01); *H04B 3/548* (2013.01); *H05K 2201/1003* (2013.01)

(58) Field of Classification Search
CPC ...... H05K 1/0233; H05K 1/02; H05K 1/0224; H05K 2201/1003
See application file for complete search history.

(56) References Cited

FOREIGN PATENT DOCUMENTS

| JP | H01-119087 A | 5/1989 |
|---|---|---|
| JP | H07-295662 A | 11/1995 |
| JP | H09-046006 A | 2/1997 |
| JP | 2008-022615 A | 1/2008 |
| JP | 2012-199904 A | 10/2012 |
| JP | 6485553 B2 | 3/2019 |
| JP | 2021-027530 A | 2/2021 |
| WO | 2018/168282 A1 | 9/2018 |

*Primary Examiner* — Jeremy C Norris
(74) *Attorney, Agent, or Firm* — Studebaker Brackett PLLC

(57) ABSTRACT

A circuit module includes a wiring board, first and second lines, a first inductor, and a sheet-like first conductor. The first line is on the wiring board, for transmitting a signal to a first circuit, outside the wiring board, and a power supply voltage for supplying power to the first circuit. The second line is on the wiring board side by side with the first line, for transmitting a signal to a second circuit and a power supply voltage for supplying power to the second circuit, which is outside the wiring board independently of the first circuit. The first inductor is on the wiring board, having one end connected to the first line, and another end connected to a power supply circuit for supplying the power. The sheet-like first conductor is on or near at least part of a side surface of a housing that holds the first inductor.

18 Claims, 37 Drawing Sheets

FIG. 27

| INTERLAYER THICKNESS (mm) | WIRING WIDTH (mm) | DISTANCE D BETWEEN WIRINGS (mm) | PARALLEL LENGTH L (mm) | |
|---|---|---|---|---|
| | | | WITH CONDUCTORS | WITH OUT CONDUCTORS |
| 0.25 | GREATER THAN OR EQUAL TO 0.35 AND LESS THAN OR EQUAL TO 0.5 | 2 | N/A | ≤ |
| | | 3 | ≤ 4 | ≤ |
| | | 4 | ≤ | * |
| 0.12 | GREATER THAN OR EQUAL TO 0.1 AND LESS THAN OR EQUAL TO 0.2 | 1 | ≤ 2 | ≤ |
| | | 2 | ≤ 8 | * |
| | | 3 | * | * |

FIG. 36

| INTERLAYER THICKNESS (mm) | WIRING WIDTH (mm) | DISTANCE D BETWEEN WIRINGS (mm) | PARALLEL LENGTH L (mm) |
|---|---|---|---|
| 0.25 | GREATER THAN OR EQUAL TO 0.35 AND LESS THAN OR EQUAL TO 0.5 | 2 | $\leq$ |
| | | 3 | $\leq$ |
| 0.12 | GREATER THAN OR EQUAL TO 0.1 AND LESS THAN OR EQUAL TO 0.2 | 1 | $\leq$ |

CIRCUIT MODULE

CROSS-REFERENCE TO RELATED APPLICATIONS

This application claims benefit of priority to Japanese Patent Application No. 2023-006895, filed Jan. 19, 2023, and to Japanese Patent Application No. 2022-035452, filed Mar. 8, 2022, the entire content of each is incorporated herein by reference.

BACKGROUND

Technical Field

The present disclosure relates to a circuit module.

Background Art

Cross talk may occur between wirings provided in parallel to each other on a substrate. Cross talk causes a phenomenon in which a signal transmitted through one wiring is transferred to another wiring or noise is generated. In order to suppress cross talk between wirings, it is effective to increase a distance between the wirings provided in parallel to each other.

However, since a demand for downsizing of recent products has been accelerated, a sufficient distance between the wirings fails be secured in some cases. In such cases, the length of portions of the wirings being parallel to each other can be decreased to suppress cross talk. However, in some cases, this is not implemented from the viewpoint of layout design.

Japanese Unexamined Patent Application Publication No. 1-119087 discloses a technique for suppressing cross talk by bending a plurality of wiring patterns in a complicated manner instead of arranging them in parallel to each other.

SUMMARY

However, the layout in which the wiring patterns are bent in a complicated manner deteriorates the quality of a transmission signal. For this reason, the technique disclosed in Japanese Unexamined Patent Application Publication No. 1-119087 is unsuitable when the transmission speed is increased. Thus, it is necessary to study a method for suppressing cross talk without deteriorating the transmission characteristics and for optimizing the layout of the mounting area.

Accordingly, the present disclosure provides a circuit module capable of minimizing deterioration of the quality of the transmission signal and optimizing the mounting area.

The circuit module according to an aspect of the present disclosure includes a wiring board, a first line, a second line, a first inductor, and a sheet-like first conductor. The first line is provided on the wiring board, for transmitting a signal to be transmitted to a first circuit and a power supply voltage for supplying power to the first circuit. The first circuit is provided outside the wiring board. The second line is provided on the wiring board side by side with the first line, for transmitting a signal to be transmitted to a second circuit and a power supply voltage for supplying power to the second circuit. The second circuit is provided outside the wiring board independently of the first circuit. The first inductor is provided on the wiring board, having one end connected to the first line, and having another end connected to a power supply circuit for supplying the power. The sheet-like first conductor is provided on or near at least part of a side surface of a housing that holds the first inductor, the side surface being close to the second line.

The circuit module according to the present disclosure can minimize deterioration of the quality of the transmission signal and optimize the mounting area.

BRIEF DESCRIPTION OF THE DRAWINGS

FIG. 27 is a table illustrating a relationship between a distance between wirings and a parallel length in wiring design for suppressing cross talk;

FIG. 36 is a table illustrating conditions of a wiring board used in each of the embodiments;

DETAILED DESCRIPTION

Hereinafter, a transmission system according to embodiments will be described in detail with reference to the drawings. Note that the present disclosure is not limited to the embodiments. Each of the embodiments is an example, and it is needless to say that the configurations illustrated in different embodiments can be partly replaced or combined. In a second and subsequent embodiments, descriptions of matters common to those in a first embodiment will be omitted, and only different points will be described. In particular, substantially the same functions and effects obtained by substantially the same configurations will not be sequentially described for each embodiment.

Transmission System

Figure 1:
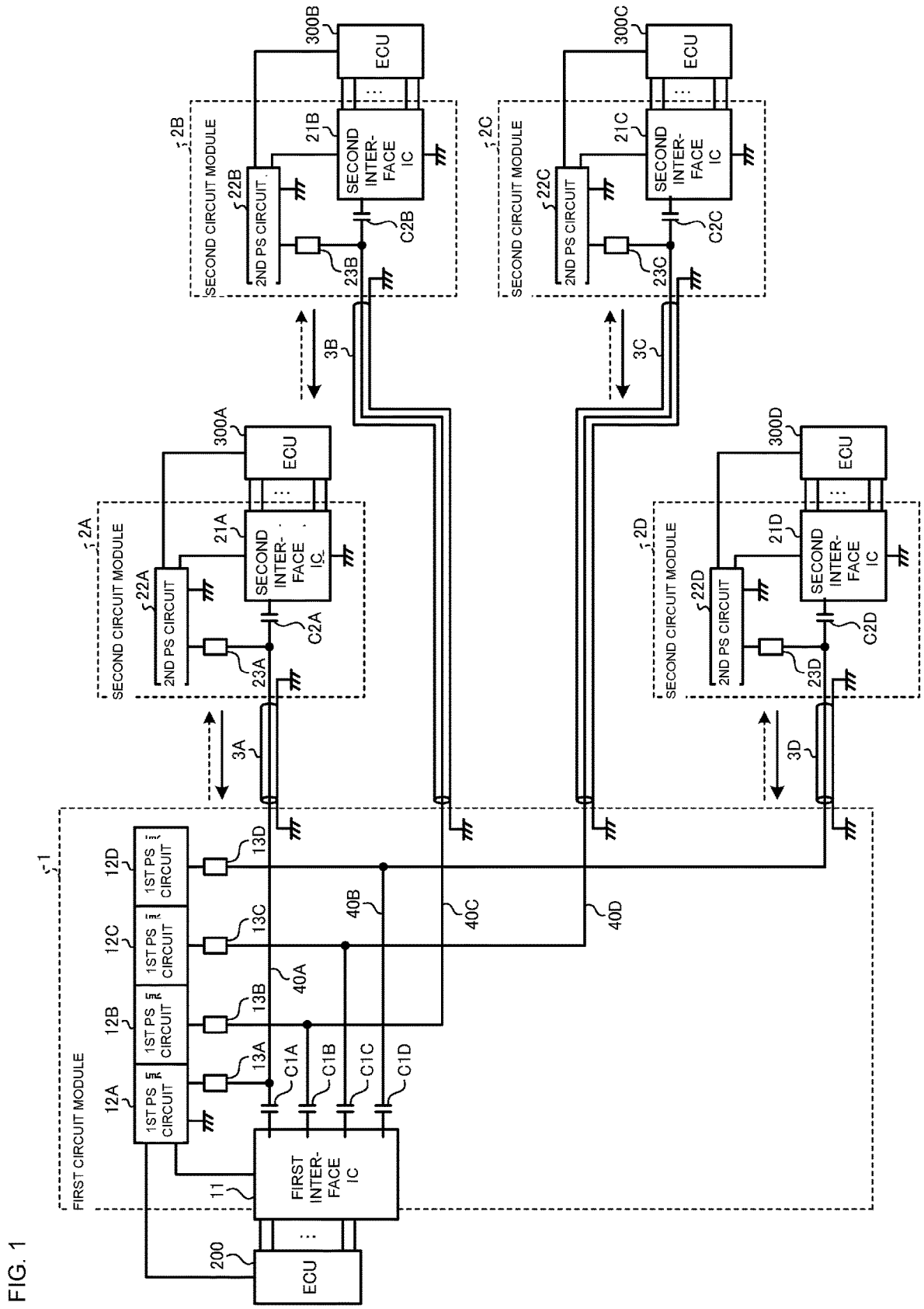
FIG. 1 is a diagram illustrating a schematic configuration of a transmission system including a circuit module according to the present disclosure.

FIG. 1 is a diagram illustrating a schematic configuration of a transmission system including a circuit module according to the present disclosure.

In FIG. 1, a transmission system implements an interface between, as connection target equipment, in-vehicle device equipment (hereinafter, also referred to as "DEV") 300 such as an in-vehicle camera and an electronic control unit (hereinafter, also referred to as "ECU") 200 as connection target equipment by a Serializer/Deserializer (SerDes) transmission system, for example. Specifically, as illustrated in FIG. 1, in the transmission system 100, a first circuit module 1 and second circuit modules 2A, 2B, 2C, and 2D are connected to each other by coaxial cables 3A, 3B, 3C, and 3D, respectively. Signals are transmitted between the first circuit module 1 and the second circuit modules 2A, 2B, 2C, and 2D.

In addition, the transmission system 100 implements power over coax (PoC) in which a DC voltage is applied to a signal transmission path and power is supplied to the DEV 300 via a coaxial cable 3.

In the example illustrated in FIG. 1, the first circuit module 1 includes a first interface IC 11, first power supply circuits (power supply circuits) 12A, 12B, 12C, 12D, and a PoC circuit 13. The second circuit module 2A, which is a circuit provided outside the first circuit module 1, includes a second interface IC 21A, a second power supply circuit 22A, and a PoC circuit 23A. A PoC circuit 13A and the PoC circuit 23A include at least an inductor.

The second circuit modules 2B, 2C, and 2D, which are separate circuits provided outside the first circuit module 1, also have the same components as the second circuit module 2A. That is, the second circuit module 2B includes a second interface IC 21B, a second power supply circuit 22B, and a PoC circuit 23B. A PoC circuit 13B and the PoC circuit 23B include at least an inductor. The second circuit module 2C includes a second interface IC 21C, a second power supply circuit 22C, and a PoC circuit 23C. A PoC circuit 13C and the PoC circuit 23C include at least an inductor. The second circuit module 2D includes a second interface IC 21D, a second power supply circuit 22D, and a PoC circuit 23D. A PoC circuit 13D and the PoC circuit 23D include at least an inductor.

The first interface IC 11 converts a signal input from the ECU 200 and outputs the converted signal to each of the second circuit modules 2A, 2B, 2C, and 2D through the coaxial cables 3A, 3B, 3C, and 3D. The first interface IC 11 converts signals input through the coaxial cables 3A, 3B, 3C, and 3D and outputs the converted signals to the ECU 200. The first interface IC 11 and the coaxial cable 3A are connected to each other by a wiring 40A. The first interface IC 11 and the coaxial cable 3B are connected to each other by a wiring 40B. The first interface IC 11 and the coaxial cable 3C are connected to each other by a wiring 40C. The first interface IC 11 and the coaxial cable 3D are connected to each other by a wiring 40D.

The second interface ICs 21A, 21B, 21C, and 21D convert signals input from the DEV 300 and output the converted signals to the first circuit module 1 through the coaxial cables 3A, 3B, 3C, and 3D. The second interface ICs 21A, 21B, 21C, and 21D also convert signals input through the coaxial cables 3A, 3B, 3C, and 3D and output the converted signals to DEVs 300A, 300B, 300C, and 300D.

In FIG. 1, the directions in which signals are transmitted from the first interface IC 11 to the second interface ICs 21A, 21B, 21C and 21D are indicated by dashed arrows. In addition, signal transmission paths from the second interface ICs 21A, 21B, 21C, and 21D to the first interface IC 11 are indicated by solid arrows.

The first power supply circuit 12A supplies power to the first interface IC 11, the ECU 200, and the like. The first power supply circuit 12A also supplies power to the signal transmission path using the coaxial cable 3A via the PoC circuit 13A. The second power supply circuit 22A receives power from the signal transmission path using the coaxial cable 3A via the PoC circuit 23A. The second power supply circuit 22A supplies power to the second interface IC 21A, the DEV 300A, and the like.

The first power supply circuit 12B supplies power to the signal transmission path using the coaxial cable 3B via the PoC circuit 13B. The second power supply circuit 22B supplies power to the second interface IC 21B, the DEV 300B, and the like.

The first power supply circuit 12C supplies power to the signal transmission path using the coaxial cable 3C via the PoC circuit 13C. The second power supply circuit 22C supplies power to the second interface IC 21C, the DEV 300C, and the like.

The first power supply circuit 12D supplies power to the signal transmission path using the coaxial cable 3D via the PoC circuit 13D. The second power supply circuit 22D supplies power to the second interface IC 21D, the DEV 300D, and the like.

In this example, the four first power supply circuits 12A, 12B, 12C, and 12D are provided in one-to-one correspondence with the four second circuit modules 2A, 2B, 2C, and 2D. However, less than four first power supply circuits may be provided, and power may be supplied from one first power supply circuit to a plurality of second circuit modules.

In FIG. 1, it is assumed that the signal transfer speed from the first interface IC 11 to the second interface ICs 21A, 21B, 21C, and 21D is lower than the signal transfer speed from the second interface ICs 21A, 21B, 21C, and 21D to the first interface IC 11. Specifically, the signal transfer speed from the first interface IC 11 to the second interface ICs 21A, 21B, 21C, and 21D is assumed to be a relatively low transfer speed of, for example, 1 [MHz] to several tens [MHz]. The signal transfer speed from the second interface ICs 21A, 21B, 21C, and 21D to the first interface IC 11 is assumed to be a relatively high transfer speed of, for example, several hundreds [MHz] to several thousands [MHz].

Figure 2:
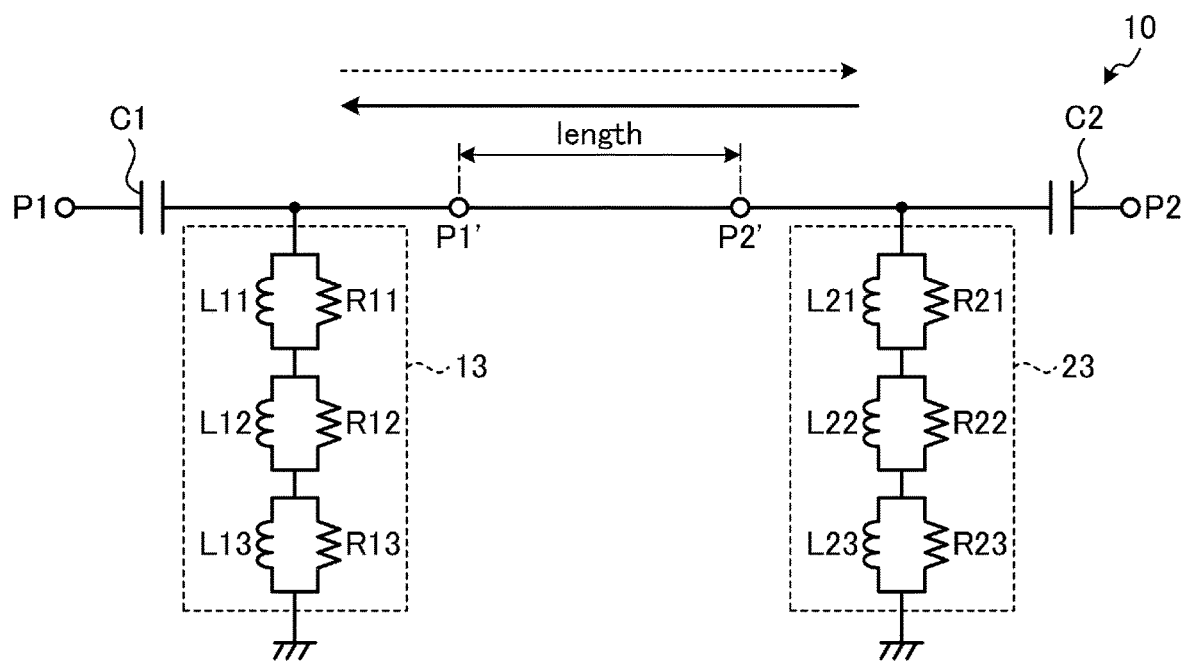
FIG. 2 is a diagram illustrating an equivalent circuit of a transmission circuit.
Figure 3:
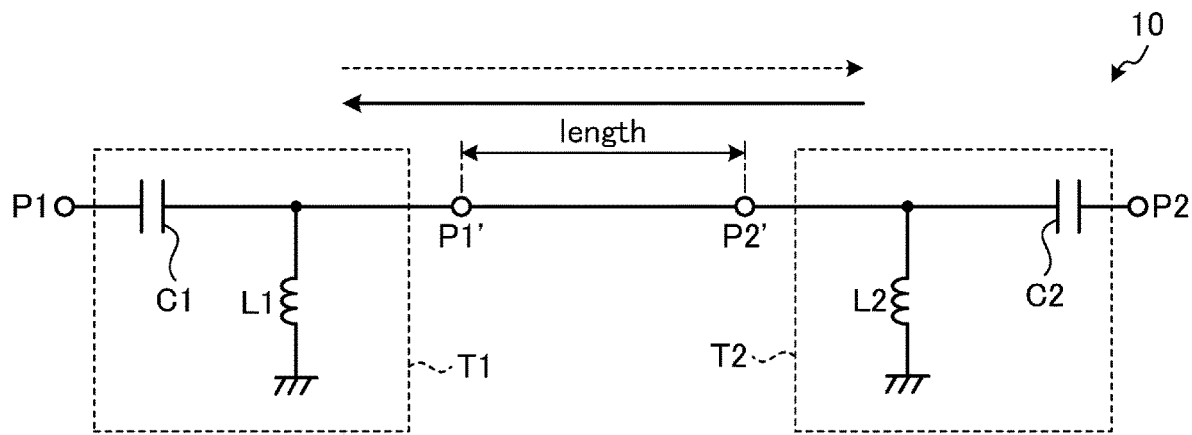
FIG. 3 is a simplified schematic diagram of the equivalent circuit illustrated in FIG. 2.

FIG. 2 is a diagram illustrating an equivalent circuit of a transmission circuit. FIG. 3 is a simplified schematic diagram of the equivalent circuit illustrated in FIG. 2. In FIG. 2, the PoC circuit 13 represents the PoC circuits 13A, 13B, 13C, and 13D in FIG. 1. In FIG. 2, a PoC circuit 23 represents the PoC circuits 23A, 23B, 23C, and 23D in FIG. 1.

As illustrated in FIG. 2, a transfer circuit 10 includes a transmission line P1'-P2' provided between a first port P1 and a second port P2, a first capacitor C1 provided between the first port P1 and the transmission line P1'-P2', a second capacitor C2 provided between the second port P2 and the transmission line P1'-P2', the PoC circuit 13 shunt-connected to a connection point between the first capacitor C1 and the transmission line P1'-P2', and the PoC circuit 23 shunt-connected to a connection point between the second capacitor C2 and the transmission line P1'-P2'.

In the example illustrated in FIG. 2, in the PoC circuit 13, for example, a parallel circuit of an inductor L11 and a resistor R11, a parallel circuit of an inductor L12 and a resistor R12, and a parallel circuit of an inductor L13 and a resistor R13 are connected in series. As illustrated in FIG. 1, an end portion of the PoC circuit 13 is connected to the first power supply circuit (power supply circuit) 12 (12A, 12B, 12C, 12D). Here, a configuration in which the end portion is connected to a GND potential is illustrated as an equivalent circuit.

The PoC circuit 13 can be simplified to a first inductor L1 as illustrated in FIG. 3. The first capacitor C1 and the first inductor L1 constitute a first bias T circuit T1. As illustrated in FIG. 3, in the present disclosure, the resistors R11, R12, and R13 illustrated in FIG. 2 are omitted (OPEN), and a simulation described below is performed.

In the example illustrated in FIG. 2, in the PoC circuit 23, for example, a parallel circuit of an inductor L21 and a resistor R21, a parallel circuit of an inductor L22 and a resistor R22, and a parallel circuit of an inductor L23 and a resistor R23 are connected in series. As illustrated in FIG. 1, an end portion of the PoC circuit 23 is connected to a second power supply circuit (power supply circuit) 22. Here, a configuration in which the end portion is connected to a GND potential is illustrated as an equivalent circuit.

The PoC circuit 23 can be simplified to a second inductor L2 as illustrated in FIG. 3. The second capacitor C2 and the second inductor L2 constitute a second bias T circuit T2. As illustrated in FIG. 3, in the present disclosure, the resistors R21, R22, and R23 illustrated in FIG. 2 are omitted (OPEN), and a simulation described below is performed.

In FIGS. 2 and 3, the first port P1 corresponds to a signal input/output terminal of the first interface IC 11. The second port P2 corresponds to a signal input/output terminal of a second interface IC 21. The transmission line P1'-P2' corresponds to the coaxial cable 3, a port P1' corresponds to a signal input/output terminal of the first circuit module 1, and a port P2' corresponds to signal input/output terminals of the second circuit modules 2A, 2B, 2C, and 2D.

Causes of and Countermeasures Against Cross Talk

Referring back to FIG. 1, cross talk may occur between wirings from the first interface IC 11 to the coaxial cables 3A, 3B, 3C, and 3D. In addition, depending on the arrangement of the PoC circuits 13A, 13B, 13C, and 13D, the inductors may be coupled to each other to cause cross talk. For example, depending on the arrangement of the inductor in the PoC circuit 13A and the inductor in the PoC circuit 13B, both may be inductively coupled to cause cross talk. The inventors have studied causes of and countermeasures against cross talk. The causes of and countermeasures against cross talk studied by the inventors will be described below. For convenience of description, in the following description, the PoC circuit 13A is referred to as an "inductor 13A", and the PoC circuit 13B is referred to as an "inductor 13B". In addition, although the following description mainly focuses on the inductors 13A and 13B, countermeasures against cross talk can be similarly applied to the PoC circuit 13C and the PoC circuit 13D.

Figure 4:
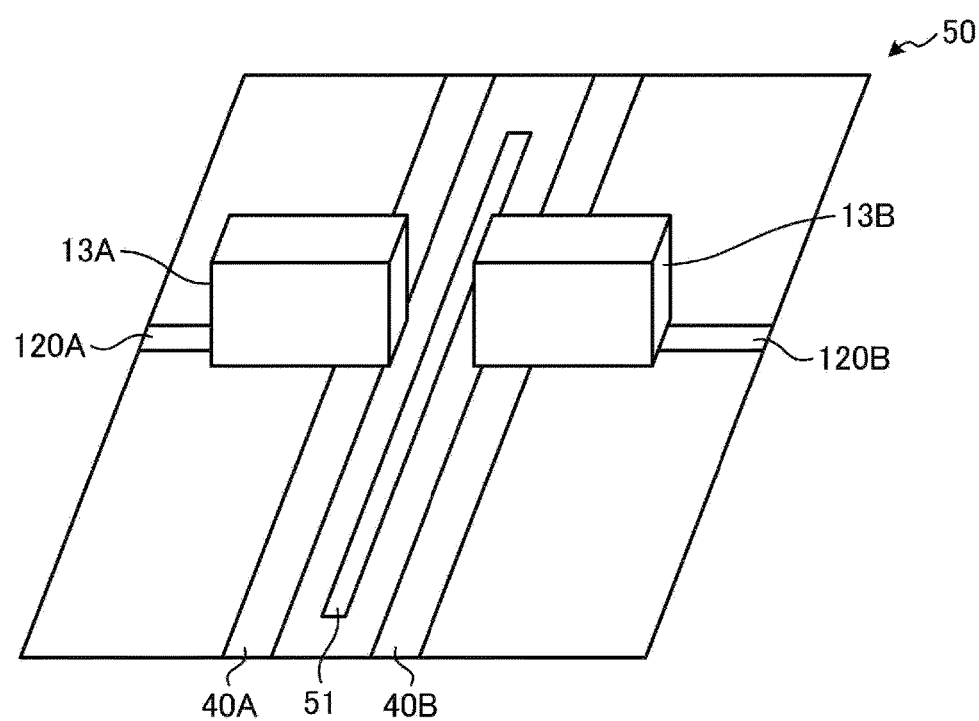
FIG. 4 is a diagram for describing cross talk between wirings.

FIG. 4 is a diagram for describing cross talk between wirings. As illustrated in FIG. 4, the wirings 40A and 40B which are transmission lines of signals to be transmitted are provided on a substrate 50 (e.g., a wiring board). The wirings 40A and 40B transmit a power supply voltage for supplying power together with a signal to be transmitted. The wirings 40A and 40B are provided substantially parallel to each other. In this example, a guard pattern 51 is provided between the wirings 40A and 40B.

The inductors 13A and 13B are provided on one main surface of the substrate 50. These correspond to the inductors 13A and 13B in FIG. 1, and are inductors for constituting a bias T circuit.

One end of the inductor 13A is connected to the wiring 40A. The other end of the inductor 13A is connected to a power supply pattern 120A. A power supply voltage from the first power supply circuit 12A in FIG. 1 is supplied to the power supply pattern 120A. One end of the inductor 13B is connected to the wiring 40B. The other end of the inductor 13B is connected to a power supply pattern 120B. A power supply voltage from the first power supply circuit 12B in FIG. 1 is supplied to the power supply pattern 120B.

As illustrated in FIG. 4, if the wirings 40A and 40B are arranged in parallel to each other or the inductors 13A and 13B are provided in the vicinity of each other, cross talk may occur. A configuration for suppressing the cross talk will be described with reference to FIGS. 5 to 10.

First Embodiment

Figure 5:
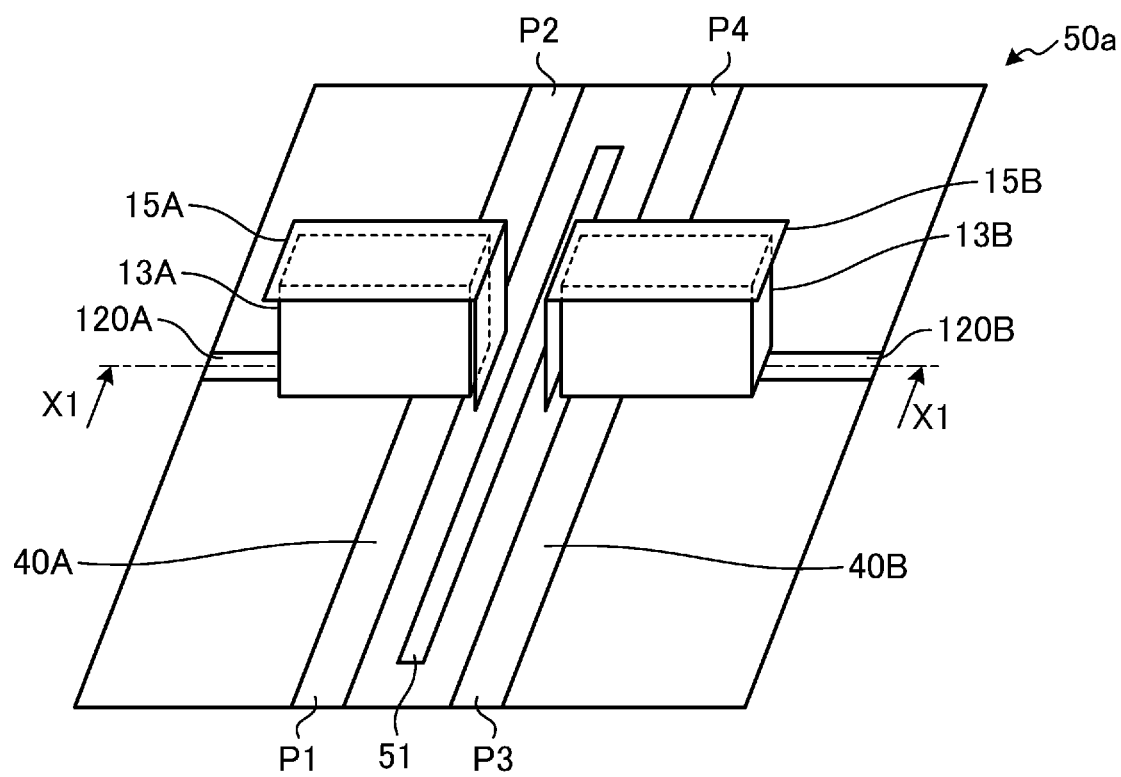
FIG. 5 is a diagram illustrating a configuration of a main portion of a circuit module according to a first embodiment of the present disclosure.
Figure 6:
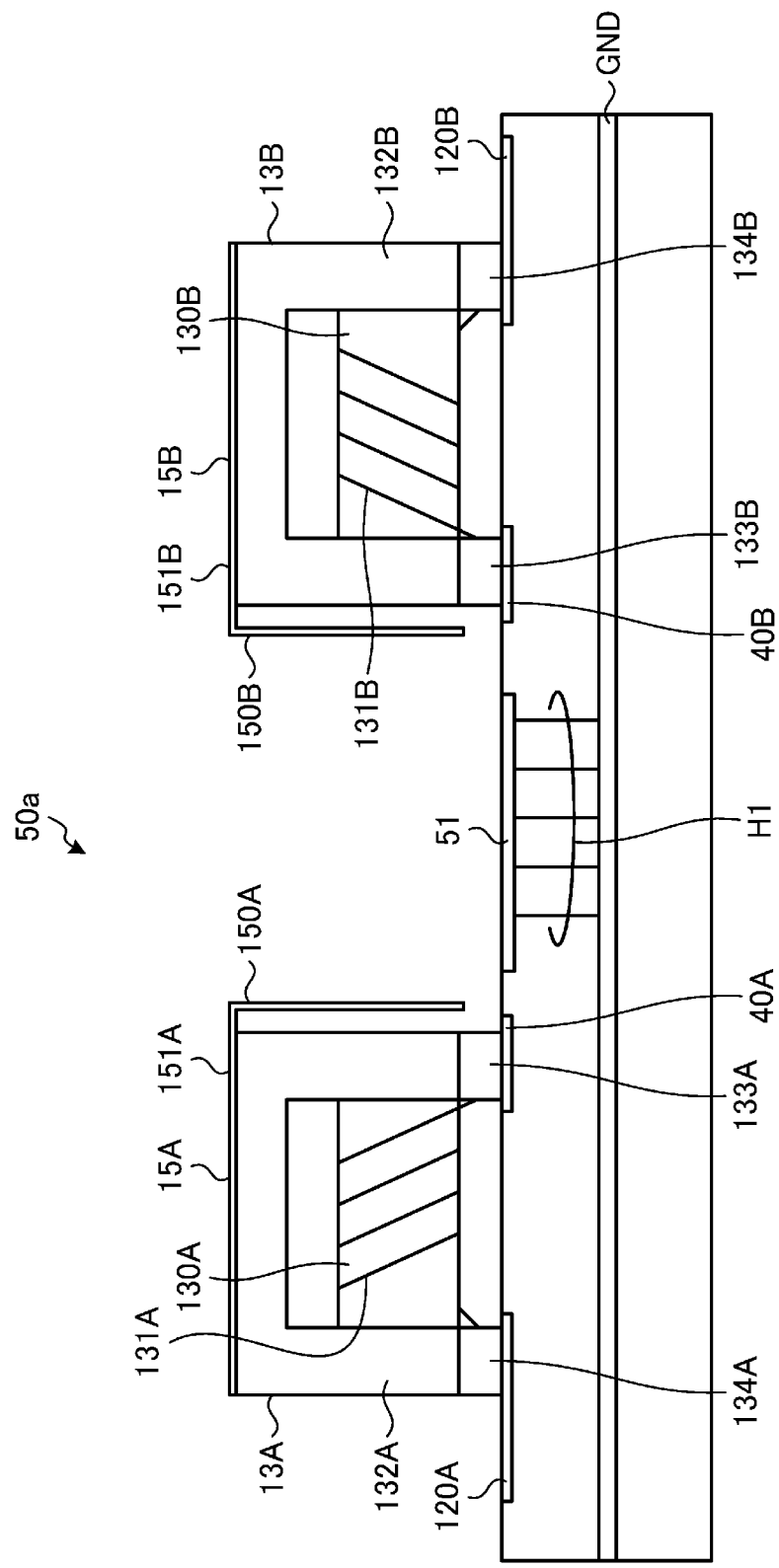
FIG. 6 is a cross-sectional view taken along line X1-X1 in FIG. 5.

FIG. 5 is a diagram illustrating a configuration of a main portion of a circuit module according to the first embodiment of the present disclosure. FIG. 5 illustrates a substrate 50a (e.g., a wiring board) which is the main portion of the circuit module. FIG. 6 is a cross-sectional view taken along line X1-X1 in FIG. 5. FIG. 6 is a cross-sectional view of the inductors 13A and 13B including the substrate 50a. The present disclosure addresses strict cross talk requirements by focusing on the PoC circuits and using a particular configuration of the inductors used in the PoC circuits.

On the substrate 50a illustrated in FIG. 6, the inductor 13A includes a core 130A formed of a magnetic material, a wound wire 131A wound around the core 130A, and a housing 132A that supports them. One end of the wound wire 131A is electrically connected to a terminal 133A. The terminal 133A is electrically connected to the wiring 40A which is a first line. The other end of the wound wire 131A is electrically connected to a terminal 134A. The terminal 134A is electrically connected to the power supply pattern 120A.

In addition, the inductor 13B includes a core 130B formed of a magnetic material, a wound wire 131B wound around the core 130B, and a housing 132B that supports them. One end of the wound wire 131B is electrically connected to a terminal 133B. The terminal 133B is electrically connected to the wiring 40B which is a second line. The other end of the wound wire 131B is electrically connected to a terminal 134B. The terminal 134B is electrically connected to the power supply pattern 120B. Note that the guard pattern 51 is electrically connected to a ground layer GND by a through hole H1.

As illustrated in FIGS. 5 and 6, on the substrate 50a of the circuit module according to the first embodiment, sheet-like conductors 15A and 15B are provided for the inductors 13A and 13B. As illustrated in FIG. 6, the conductors 15A and 15B are bent in an L-shape. The sheet-like shape refers to a shape (planar shape) having a two dimensional plane and having a thickness smaller than the length and width.

The conductor 15A covers part of a surface of the inductor 13A. The conductor 15A has a side surface portion 150A and an upper surface portion 151A. The side surface portion 150A of the conductor 15A covers, among side surfaces of a housing of the inductor 13A, a side surface close to the wiring 40B, which is a second line. That is, the side surface portion 150A covers, among side surfaces of the housing of the inductor 13A, the side surface close to the wiring 40B. The upper surface portion 151A of the conductor 15A covers an upper surface of the inductor 13A.

The conductor 15B covers part of a surface of the inductor 13B. The conductor 15B has a side surface portion 150B and an upper surface portion 151B. The side surface portion 150B of the conductor 15B covers, among side surfaces of a housing of the inductor 13B, a side surface close to the wiring 40A, which is a first line. That is, the side surface portion 150B covers, among side surfaces of the housing of the inductor 13B, the side surface close to the wiring 40A. The upper surface portion 151B of the conductor 15B covers an upper surface of the inductor 13B.

In this embodiment, the conductors 15A and 15B are formed by bending copper foils. The conductors 15A and 15B can cover the opposing surfaces of the inductors 13A and 13B and their upper surfaces. Accordingly, cross talk can be suppressed.

The inductors 13A and 13B in which the conductors 15A and 15B are arranged on the side surfaces including the height direction of the housings of the inductors are mounted on the two wirings 40A and 40B, respectively. Thus, the conductor 15A is provided on or near at least part of the side surface of the housing that holds the inductor 13A close to the wiring 40B. The conductor 15B is provided on or near at least part of the side surface of the housing that holds the inductor 13B close to the wiring 40A. By arranging the inductors 13A and 13B in this manner, cross talk can be suppressed by an eddy-current loss (absorption loss) effect generated in the conductors 15A and 15B.

Here, the conductors 15A and 15B are formed as in the following (1) to (3), for example.
(1) Conductors made of thin metal foils are bonded to the surfaces of the inductors 13A and 13B with an adhesive.
(2) The conductors are formed by press molding using a metal plate which can be bent. Metal plates are molded so as to be partially hooked to the shapes of the housings 132A and 132B of the inductors, and bonded to the housings 132A and 132B by latches.
(3) Metal portions are provided in part of the housings 132A and 132B of the inductors, and conductors are bonded to the metal portions by a method such as thermocompression bonding.

Conductors formed in the same manner are also used in the following embodiments. The sheet-like conductor includes a conductor formed on the surface of the housing of the inductor by vapor deposition or plating. That is, instead of using the conductors 15A and 15B, a conductive coating material may be directly applied to the housings of the inductors, or conductors may be formed on the surfaces of the housings of the inductors by vapor deposition or plating. The same applies to the following embodiments. Note that embodiments of forming the conductors by vapor deposition or plating will be described later.

Second Embodiment

Figure 7:
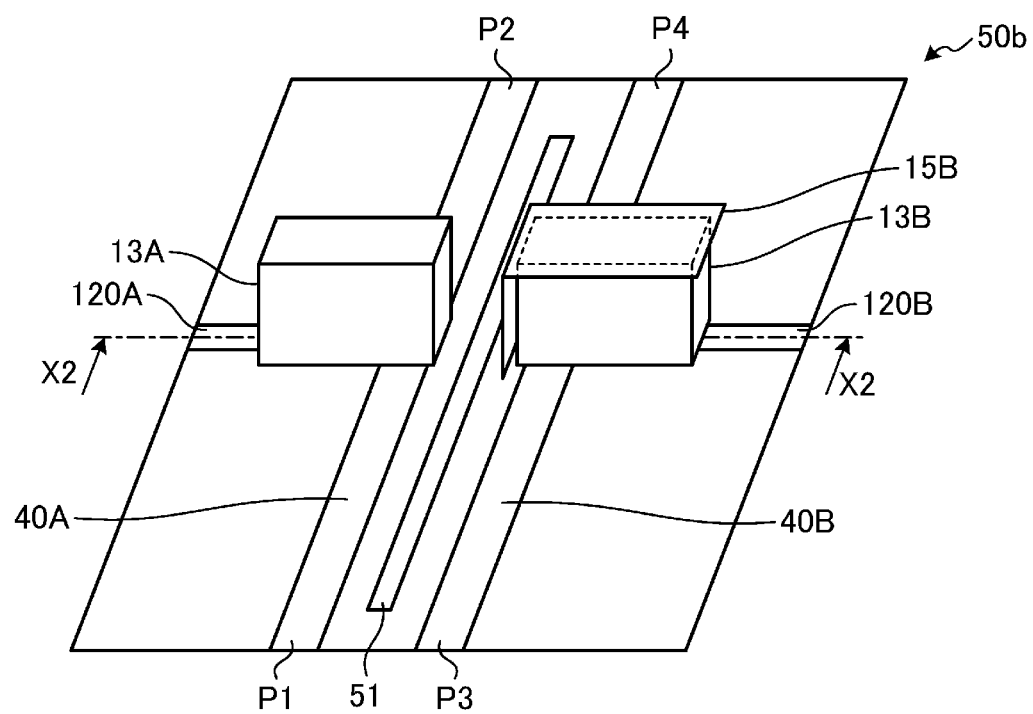
FIG. 7 is a diagram illustrating a configuration of a main portion of a circuit module according to a second embodiment of the present disclosure.
Figure 8:
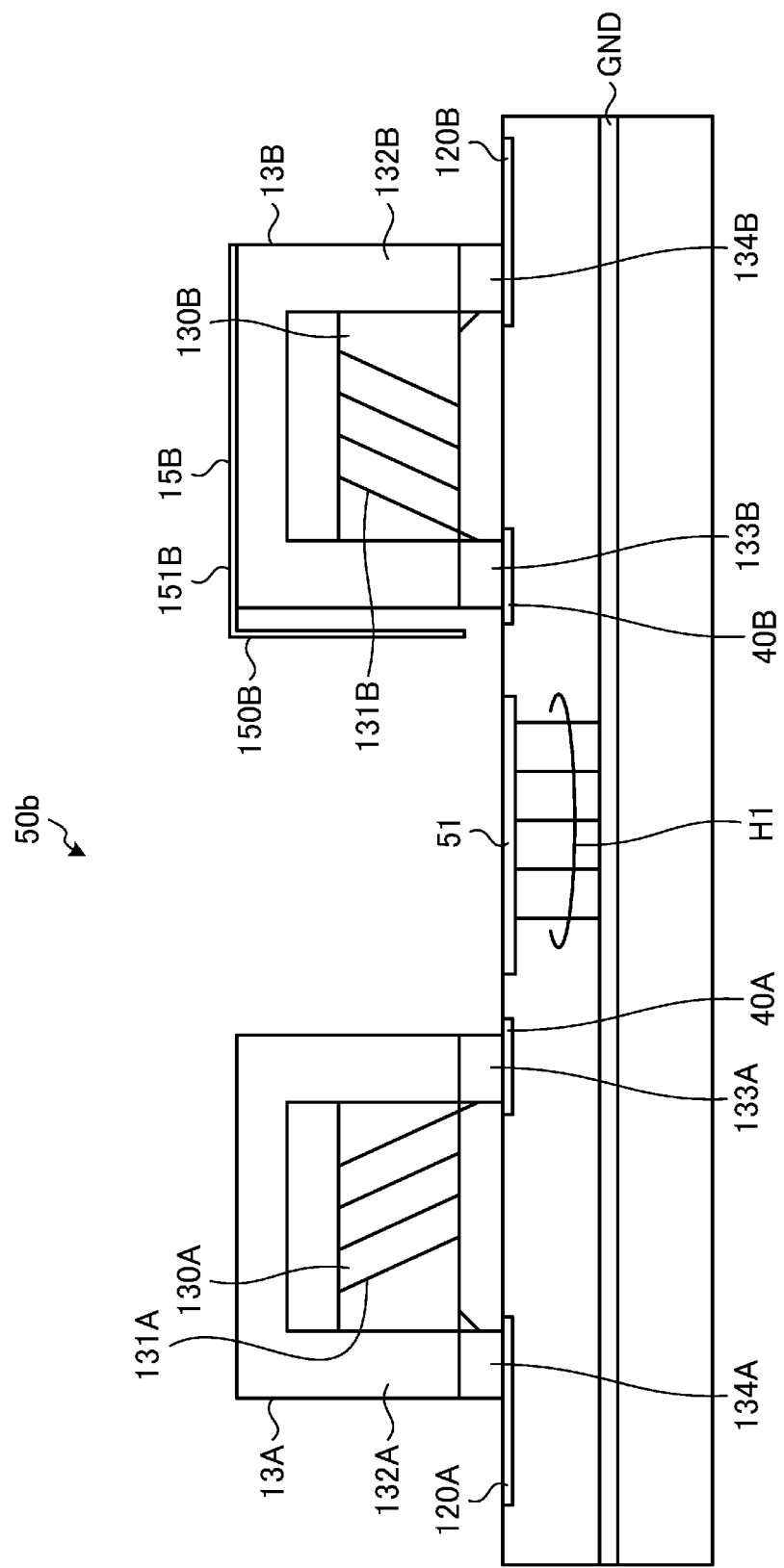
FIG. 8 is a cross-sectional view taken along line X2-X2 in FIG. 7.

FIG. 7 is a diagram illustrating a configuration of a main portion of a circuit module according to the second embodiment of the present disclosure. FIG. 7 illustrates a substrate 50b which is the main portion of the circuit module. FIG. 8 is a cross-sectional view taken along line X2-X2 in FIG. 7. FIG. 8 is a cross-sectional view of the inductors 13A and 13B including the substrate 50b. In the second embodiment, a sheet-like conductor is provided for one inductor, and no sheet-like conductor is provided for the other inductor.

As illustrated in FIGS. 7 and 8, on the substrate 50b of the circuit module according to the second embodiment, the sheet-like conductor 15B is provided for the inductor 13B, and no sheet-like conductor is provided for the inductor 13A. The conductor 15B is formed in the same manner as in the first embodiment. As illustrated in FIG. 8, the conductor 15B is bent in an L-shape.

In the second embodiment, the inductor 13B for which the conductor is provided on or near a side surface including the height direction of the housing of the inductor is mounted on the wiring 40B. By arranging the inductor 13B in this manner, cross talk can be suppressed by an eddy-current loss (absorption loss) effect generated in the conductor 15B.

Third Embodiment

Figure 9:
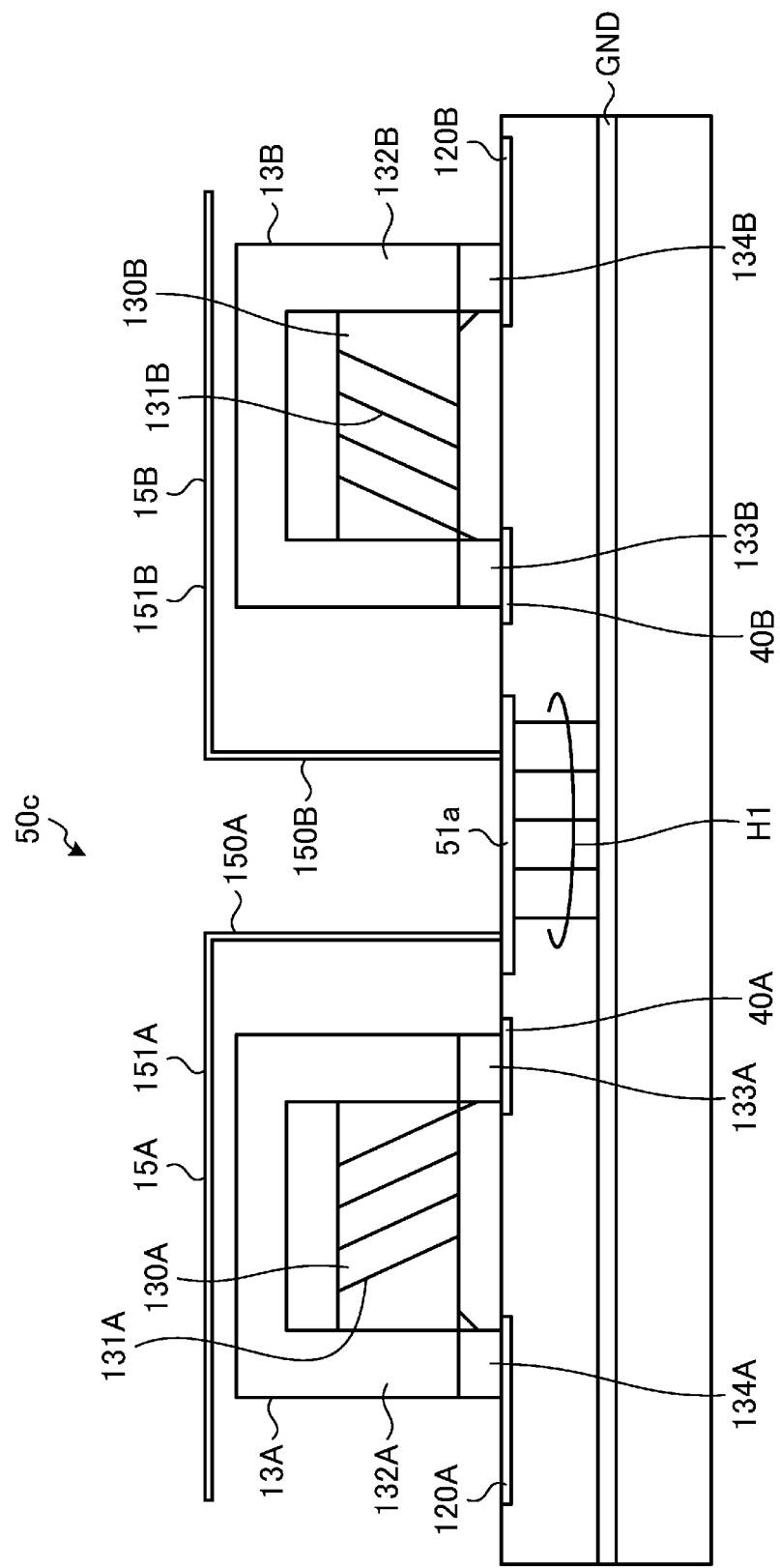
FIG. 9 is a diagram illustrating a configuration of a main portion of a circuit module according to a third embodiment of the present disclosure.

FIG. 9 is a diagram illustrating a configuration of a main portion of a circuit module according to a third embodiment of the present disclosure. FIG. 9 illustrates a substrate 50c which is the main portion of the circuit module. FIG. 9 is a cross-sectional view taken along a portion corresponding to line X2-X2 in FIG. 7 in the substrate 50c. FIG. 9 is a cross-sectional view of the inductors 13A and 13B including the substrate 50c. In the third embodiment, the conductors 15A and 15B are set to the ground potential.

The inductor is mounted as illustrated in FIG. 9, and the conductors 15A and 15B are provided so as to surround part of the inductor 13A and part of the inductor 13B. An end portion of the conductor 15A is electrically connected to a guard pattern 51a. Therefore, the conductor 15A is at the ground potential. An end portion of the conductor 15B is electrically connected to the guard pattern 51a. Therefore, the conductor 15B is at the ground potential. Cross talk can be suppressed by an eddy-current loss (absorption loss) effect generated in the conductors 15A and 15B.

Cross Talk Suppression Effect

The inventors have verified a cross talk suppression effect by using the conductors. Specifically, first, in the substrate 50a illustrated in FIG. 5, one end of the wiring 40A is set as a port P1, the other end thereof is set as a port P2, one end of the wiring 40B is set as a port P3, and the other end thereof is set as a port P4. Then, the port P1 and the port P3 are set as measurement targets, and an S (Scattering) parameter (S31) is checked. In the measurement, an inductor having a size of about 3.2 mm long and about 2.5 mm wide and an inductance value of 2.2 µH is used.

Figure 10:
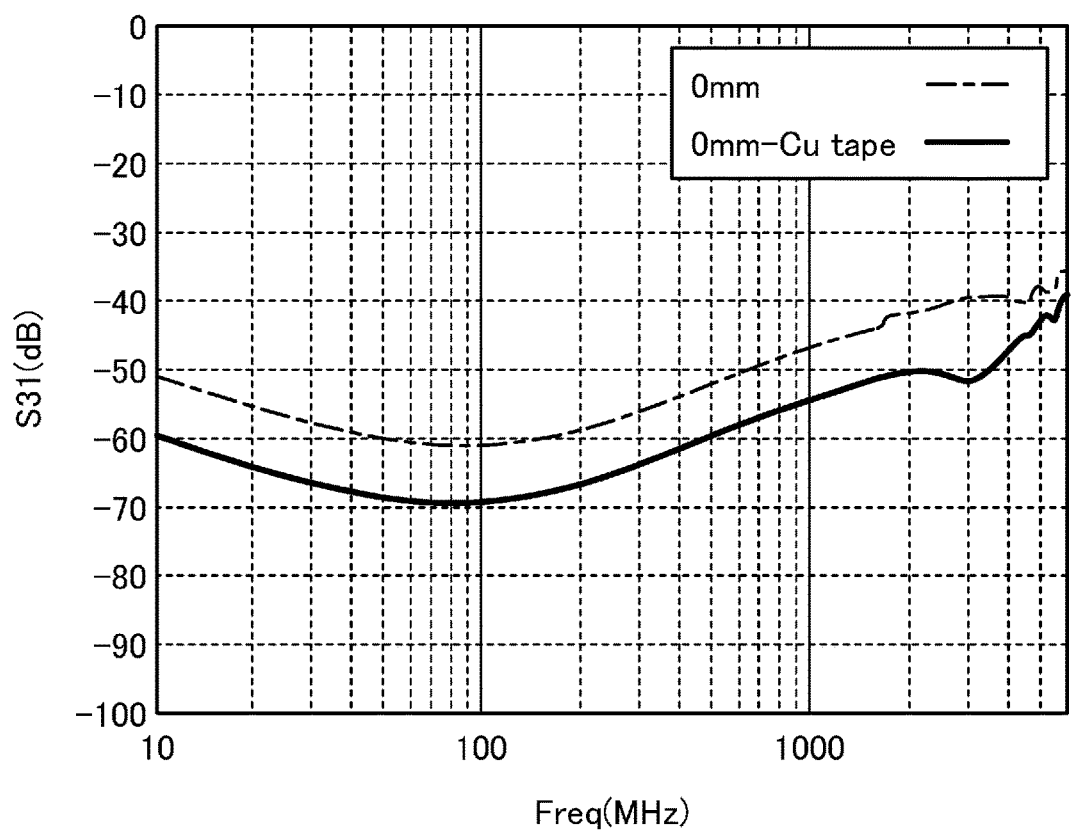
FIG. 10 is a diagram for describing an effect obtained if sheet-like conductors are provided.

FIG. 10 is a graph for describing an effect obtained if the conductors are provided. FIG. 10 is a graph illustrating measurement results of the S parameter. In FIG. 10, the dashed-and-dotted line indicates cross talk that occurs if no copper foils are provided, and the solid line indicates cross talk that occurs if the copper foils are provided. As can be found from FIG. 10, it can be confirmed that by providing the conductors 15A and 15B, cross talk can be suppressed by about 10 dB. That is, if the conductors 15A and 15B are provided, the value of the S parameter (S31) is lower than that in a case in which the conductors 15A and 15B are not provided, and cross talk is suppressed.

Figure 11:
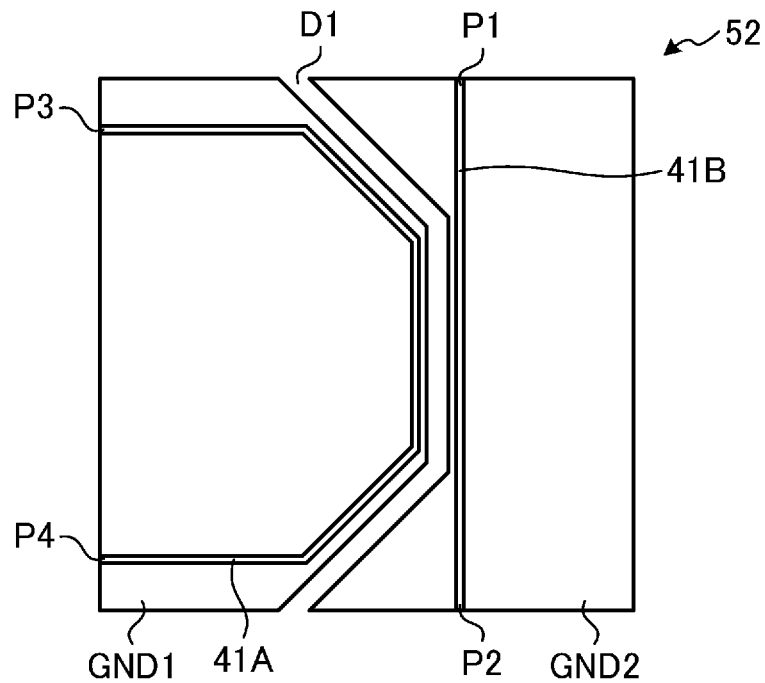
FIG. 11 is a diagram for describing a simulation for elucidating a coupling mechanism of cross talk.
Figure 12:
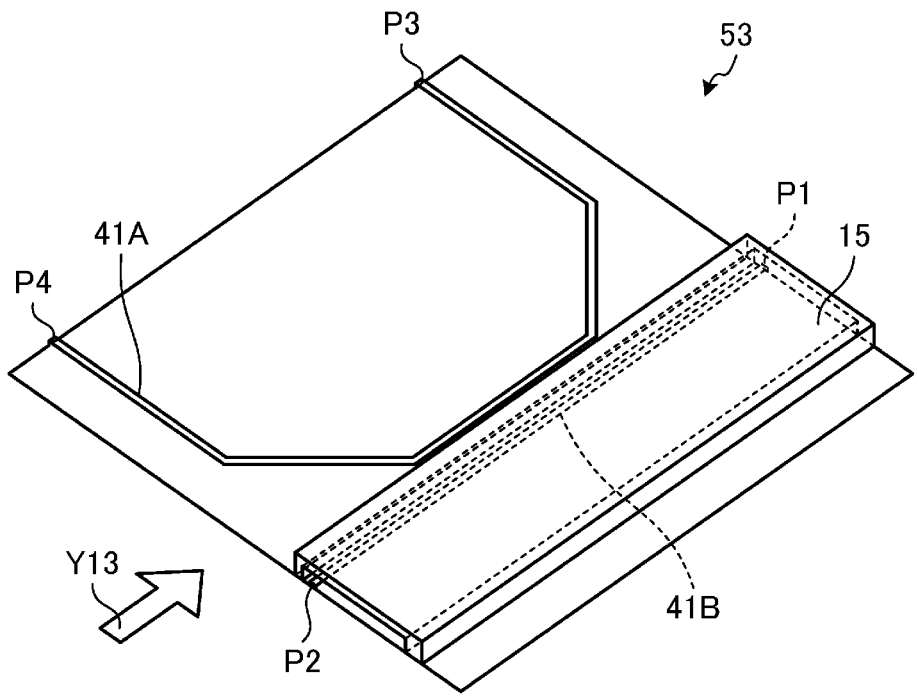
FIG. 12 is a diagram for describing a simulation for elucidating the coupling mechanism of cross talk.
Figure 13:
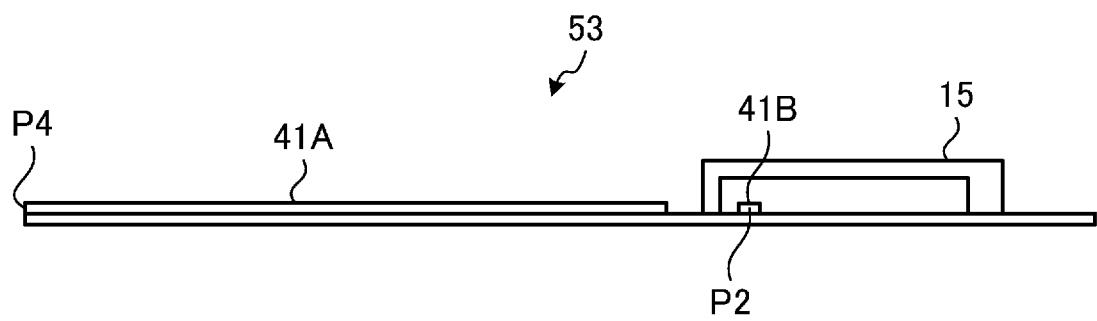
FIG. 13 is a diagram for describing the simulation for elucidating the coupling mechanism of cross talk.

Next, the inventors have performed simulations for elucidating a coupling mechanism of cross talk. FIGS. 11 to 13 are diagrams for describing the simulations for elucidating the coupling mechanism of cross talk.

In FIG. 11, a substrate 52 includes ground layers GND1 and GND2, a wiring 41A provided above the ground layer GND1, and a wiring 41B provided above the ground layer GND2. In FIG. 11, a dielectric is provided between the ground layer GND1 and the wiring 41A. In addition, a dielectric is provided between the ground layer GND2 and the wiring 41B.

In FIG. 11, since there is an insulating portion D1 where no conductive layer is provided, the ground layer GND1 and the ground layer GND2 are electrically isolated from each other. If cross talk can be suppressed by the isolation of the ground layers as illustrated in FIG. 11, cross talk can be assumed to occur through the ground layers in internal layers of the substrate 52.

FIG. 12 is a diagram illustrating an example in which the wiring 41B is covered with a shield. A substrate 53 in FIG. 12 has the same wirings 41A and 41B as the substrate 52 in FIG. 11, and a state in which a metal shield 15 is provided on the substrate without the insulating portion D1 in FIG. 11 is illustrated. The shield 15 is electrically connected to a ground layer of the substrate 53.

FIG. 13 is a view of a state in which the substrate 53 is viewed from a direction indicated by an arrow Y13 in FIG. 12. As illustrated in FIGS. 12 and 13, the shield 15 is provided so as to cover the wiring 41B. That is, the wiring 41B is provided in a space surrounded by the shield 15 and the ground layer of the substrate 53. Thus, if cross talk can be suppressed by the addition of the shield 15, cross talk can be assumed to occur through the space above the substrate 53.

Figure 14:
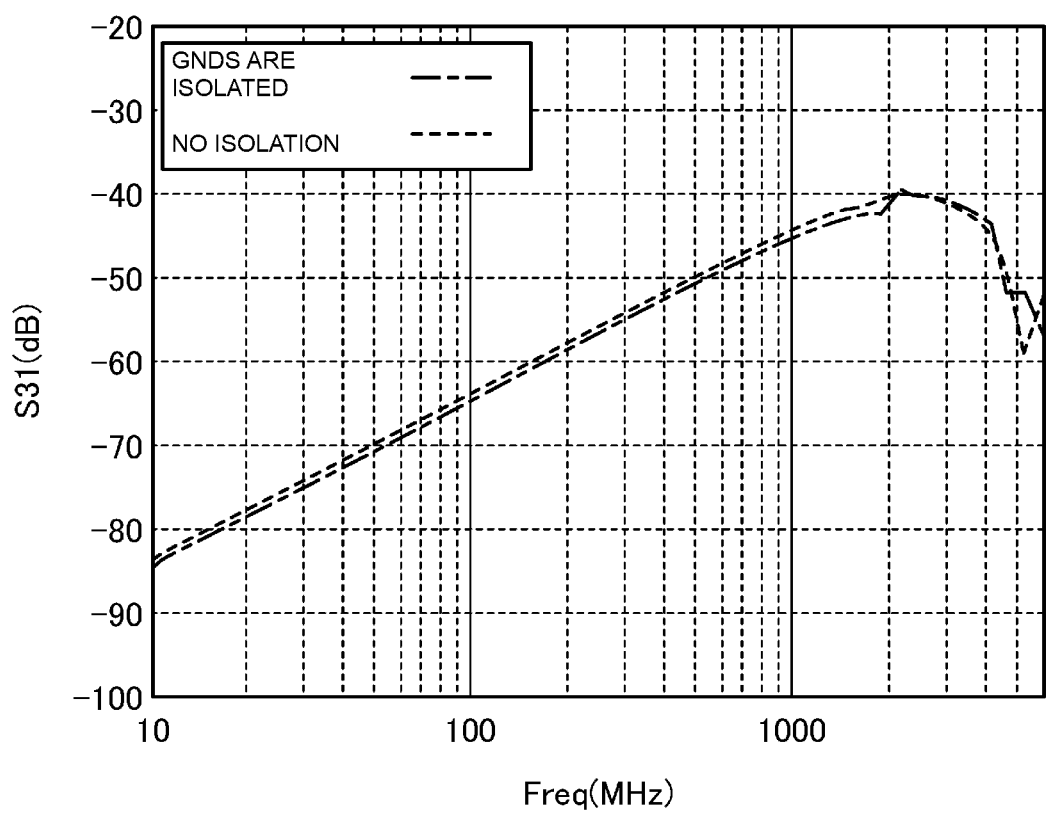
FIG. 14 is a graph illustrating results of the simulation performed using a substrate illustrated in FIG. 11.

FIG. 14 is a graph illustrating results of a simulation performed using the substrate illustrated in FIG. 11. In FIG. 14, the dashed-and-dotted line indicates a case in which the ground layer GND1 and the ground layer GND2 are electrically isolated from each other by the insulating portion D1 provided therebetween. Also in FIG. 14, the broken line indicates a case in which the insulating portion D1 is not provided and the ground layers are not isolated from each other. As illustrated in FIG. 14, the dashed-and-dotted line and the broken line indicate similar characteristics. Therefore, it can be found that the isolation of the ground layers has no effect of suppressing cross talk.

Figure 15:
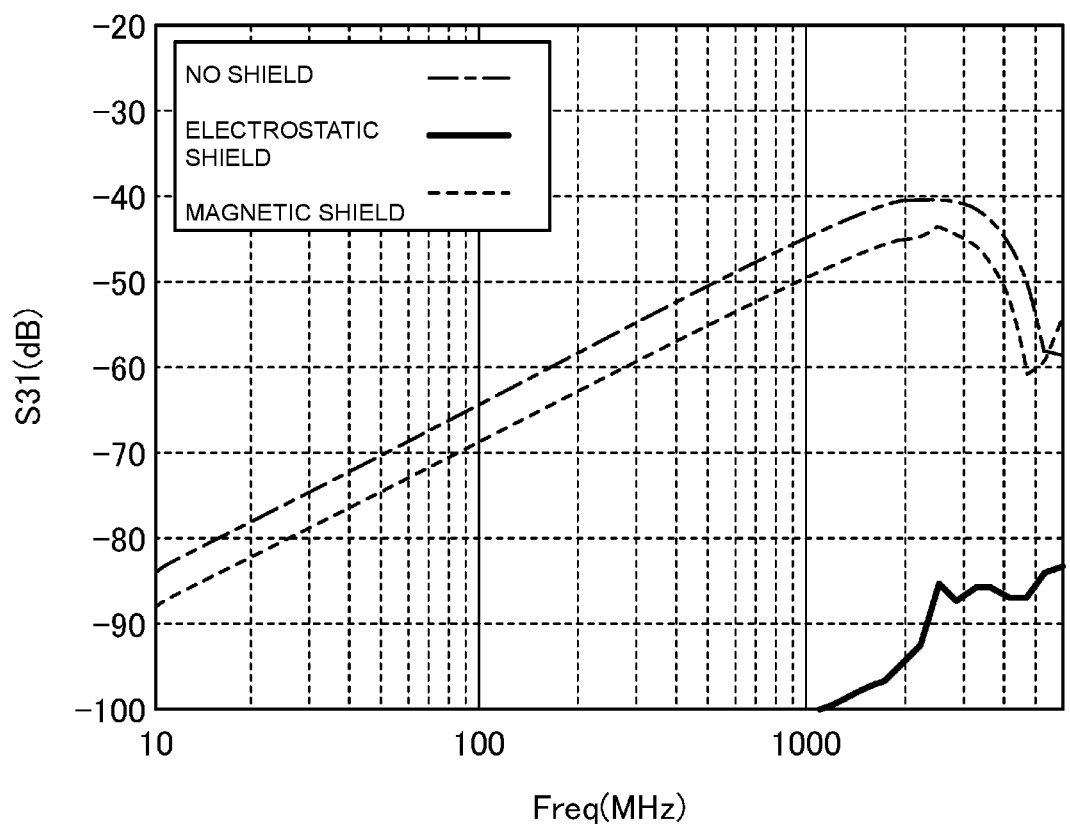
FIG. 15 is a graph illustrating results of the simulation performed using a substrate illustrated in FIGS. 12 and 13.

FIG. 15 is a graph illustrating results of a simulation performed using the substrate illustrated in FIGS. 12 and 13. In FIG. 15, the dashed-and-dotted line indicates a case in which the shield 15 is not provided. Also in FIG. 15, the solid line indicates characteristics obtained by using an electrostatic shield, and the broken line indicates characteristics obtained by using a magnetic shield.

As illustrated in FIG. 15, it is found that if the shield 15 is provided as illustrated in FIGS. 12 and 13, an effect of using the electrostatic shield is generated, and also, an effect of using the magnetic shield is generated, to suppress cross talk. By providing the shield 15, the cross talk suppression effect can be obtained in both cases of using the magnetic shield and the electrostatic shield.

From the results illustrated in FIGS. 14 and 15, it is confirmed that coupling between the wirings occurs through the space above the substrate 53 in FIG. 12. By providing the shield 15, the cross talk suppression effect can be obtained as illustrated in FIG. 10.

Case of Displacement

From the above, it is confirmed that the shield above the substrate is effective. The inventors have confirmed the cross talk suppression effect obtained if the inductors are mounted at positions displaced from each other in the wiring length direction in order to increase an actual shield area.

Figure 16:
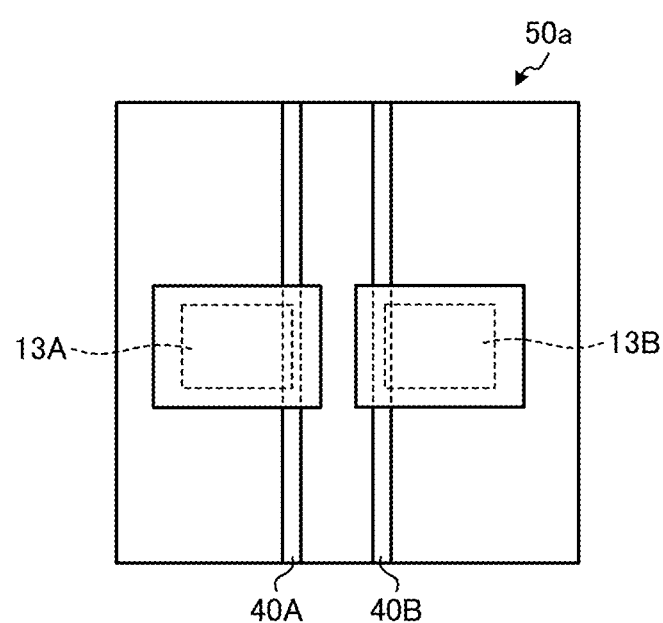
FIG. 16 is a plan view of a state in which one main surface of a substrate described with reference to FIGS. 5 and 6 is viewed from above.

FIG. 16 is a plan view of a state in which the one main surface of the substrate 50a described with reference to FIGS. 5 and 6 is viewed from above. In the state illustrated in FIG. 16, the positions of the inductors 13A and 13B in the longitudinal direction of the wirings 40A and 40B are the same. Therefore, a side surface of the inductor 13A close to the wiring 40B and a side surface of the inductor 13B close to the wiring 40A are opposed to each other.

Figure 17:
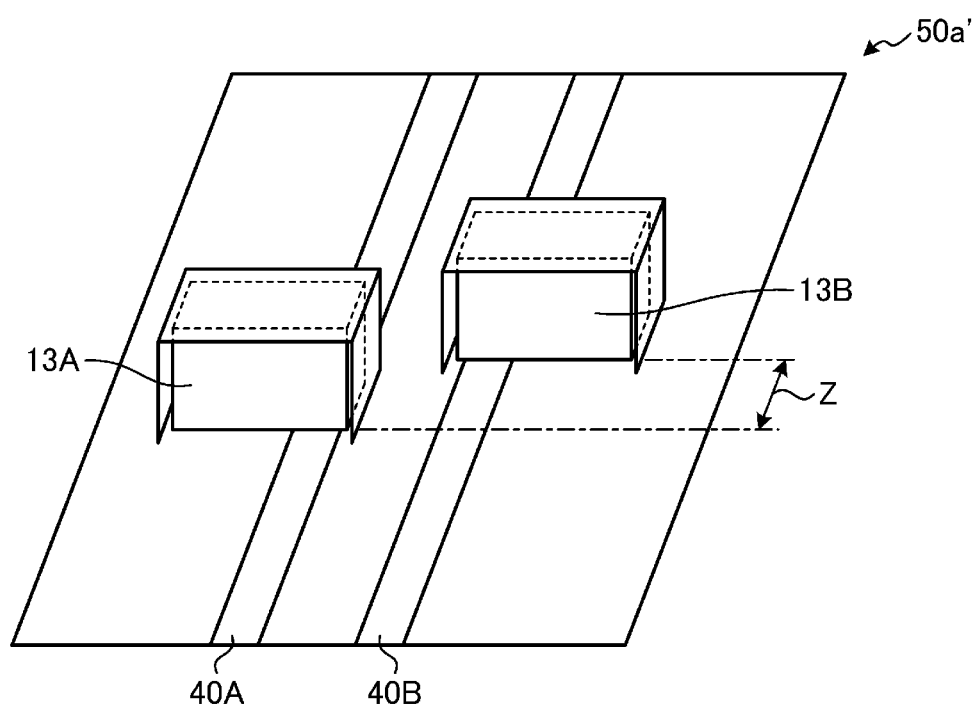
FIG. 17 is a diagram illustrating a substrate on which inductors are displaced from each other in a longitudinal direction of wirings.
Figure 18:
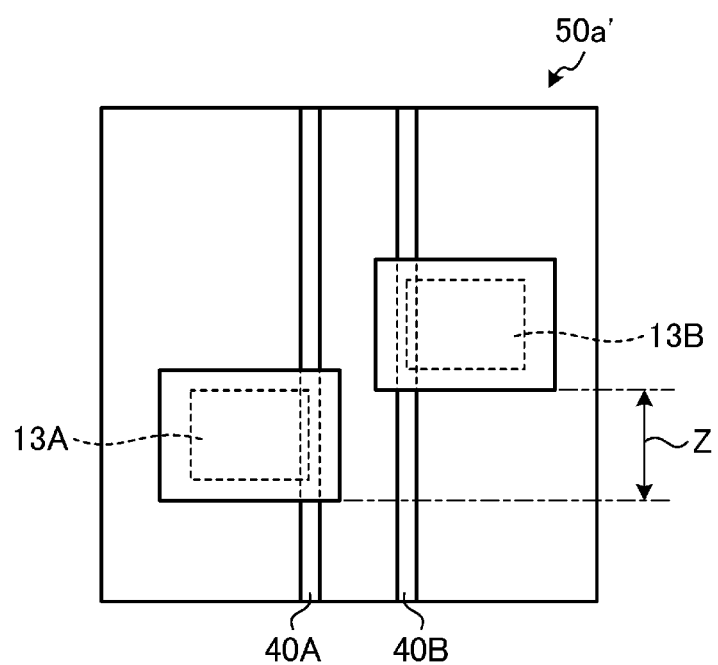
FIG. 18 is a plan view of a state in which one main surface of the substrate is viewed from above.

FIG. 17 is a diagram illustrating a substrate 50a' on which the inductors 13A and 13B are displaced from each other in the longitudinal direction of the wirings 40A and 40B. FIG. 18 is a plan view of a state in which one main surface of the substrate 50a' is viewed from above. As illustrated in FIGS. 17 and 18, the inductors 13A and 13B are mounted at positions displaced in the longitudinal direction of the wirings 40A and 40B. In this example, a displacement amount Z is 4 mm. In a case of FIG. 16 described above, the displacement amount is 0 mm.

Figure 19:
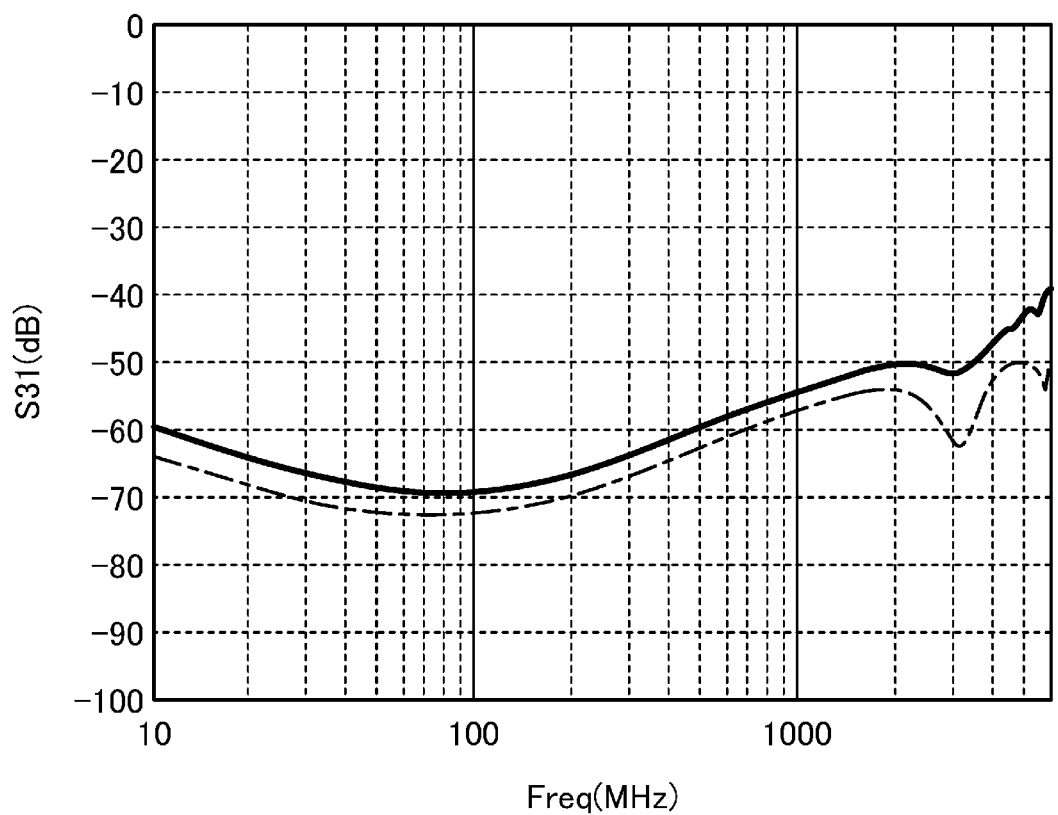
FIG. 19 is a graph illustrating measurement results of an S parameter obtained in a case of arrangement in FIGS. 17 and 18.

FIG. 19 is a graph illustrating measurement results of the S parameter (S31) obtained in a case of arrangement in FIGS. 17 and 18. In FIG. 19, the solid line indicates a case in which the displacement amount is 0 mm, and the dashed-and-dotted line indicates a case in which the displacement amount is 4 mm. As illustrated in FIG. 19, the cross talk suppression effect of 3 dB to 5 dB can be obtained if the displacement amount is 4 mm as compared to a case in which the displacement amount is 0 mm.

Distance Between Wirings and Parallel Length

Next, the inventors have verified the cross talk suppression effect obtained if the distance between the wirings or the length of a portion of the wirings being parallel to each other is changed. First, a simulation model for verifying the cross talk suppression effect is created.

Figure 20:
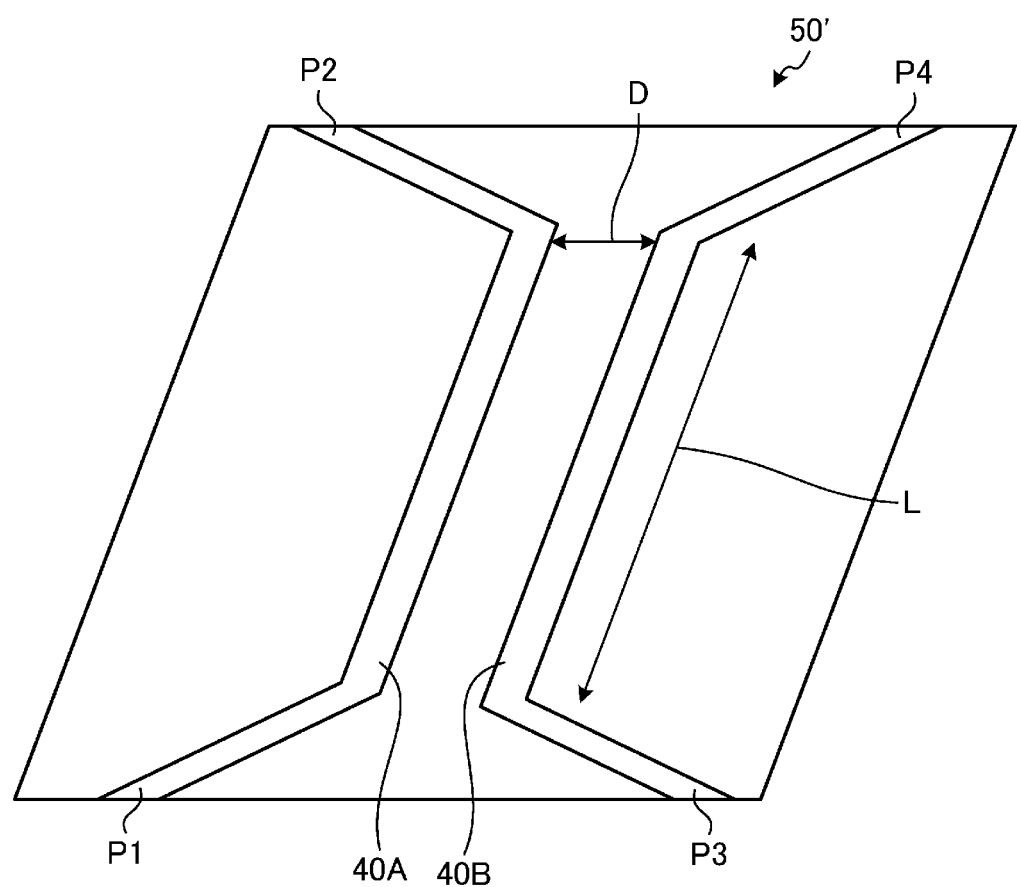
FIG. 20 is a diagram illustrating a simulation model for verifying a cross talk suppression effect.

FIG. 20 is a diagram illustrating the simulation model for verifying the cross talk suppression effect. In FIG. 20, the wirings 40A and 40B are provided on a substrate 50'. That is, two microstrip lines are provided close to each other. The length between the wiring 40A and the wiring 40B is defined as a distance D. In addition, the length of a portion of the wirings 40A and 40B being in parallel to each other is referred to as a parallel length L. In such a simulation model, the S parameter (S31) is measured while the distance D and the parallel length L are changing, and the cross talk suppression effect is verified.

Figure 21:
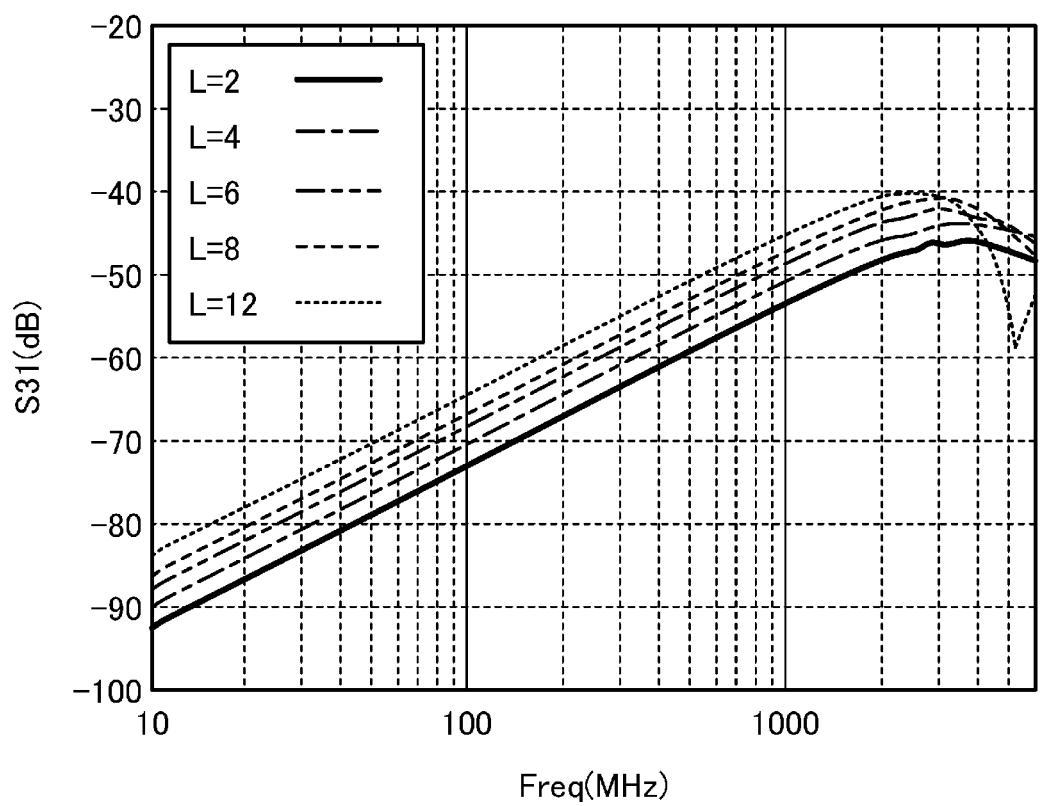
FIG. 21 is a graph illustrating simulation results obtained by using microstrip line models matched at 50Ω with an interlayer thickness of a substrate being 0.25 mm.
Figure 22:
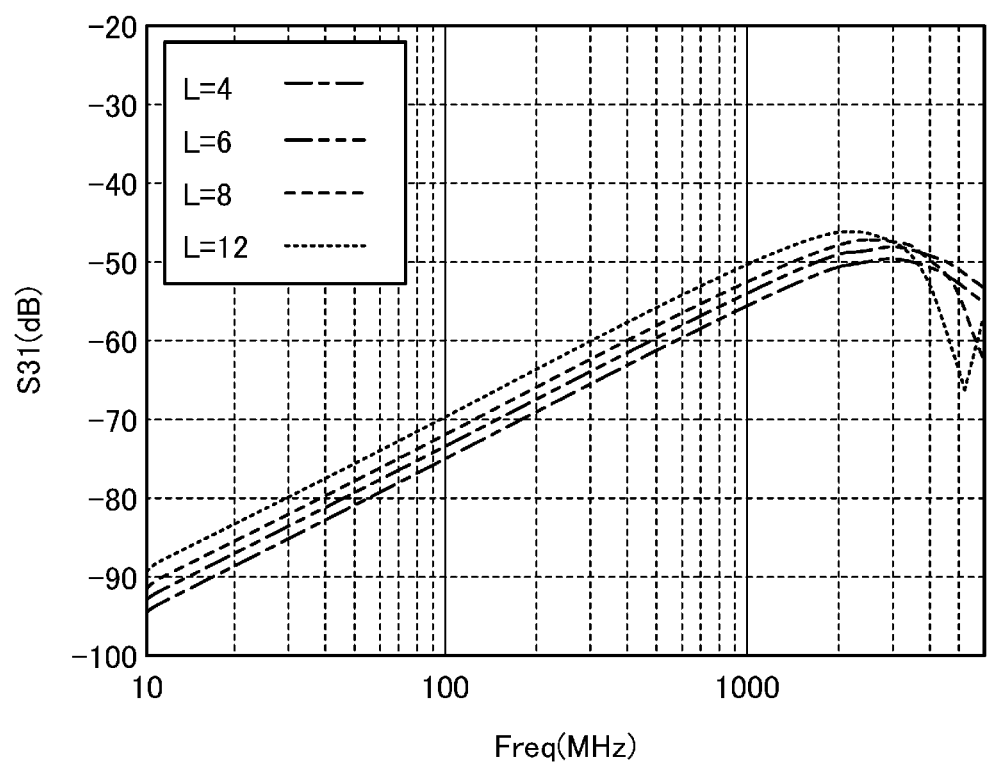
FIG. 22 is a graph illustrating simulation results obtained by using microstrip line models matched at 50Ω with an interlayer thickness of a substrate being 0.25 mm.
Figure 23:
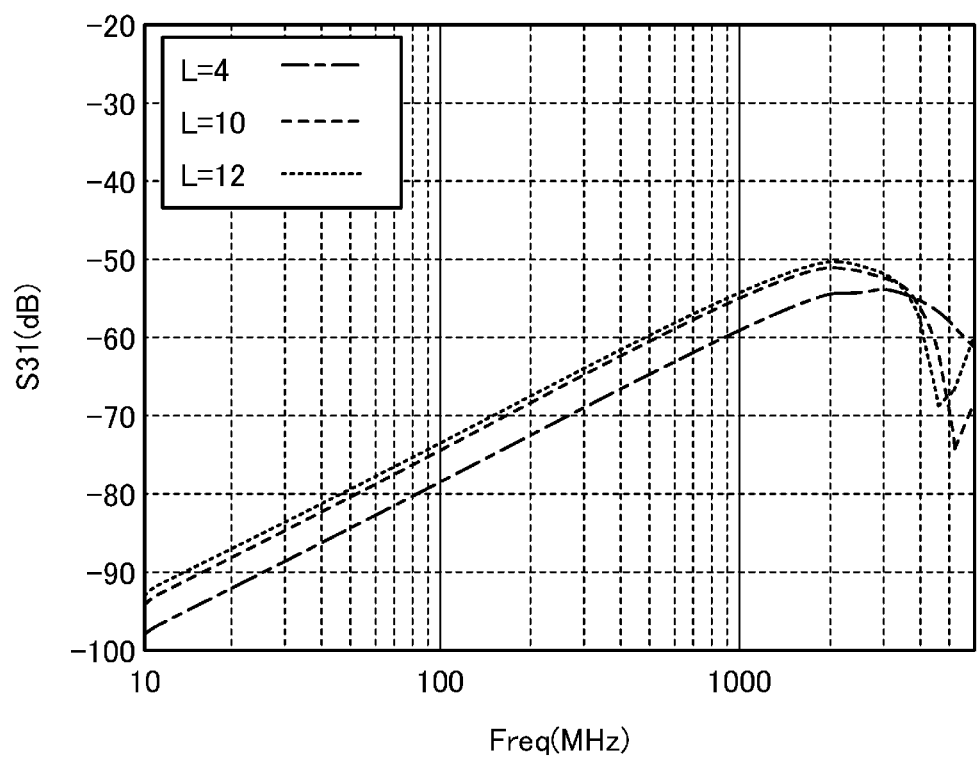
FIG. 23 is a graph illustrating simulation results obtained by using microstrip line models matched at 50Ω with an interlayer thickness of a substrate being 0.25 mm.

FIGS. 21 to 23 are graphs illustrating simulation results obtained by using microstrip line models matched at 50Ω with an interlayer thickness of the substrate 50' being 0.25 mm. An assumed substrate is a 6-layer substrate having a substrate thickness of 1.5 mm or a 4-layer substrate having a substrate thickness of 0.8 mm. FIG. 21 illustrates a case in which the distance D=2 mm. FIG. 22 illustrates a case in which the distance D=3 mm. FIG. 23 illustrates a case in which the distance D=4 mm.

Figure 24:
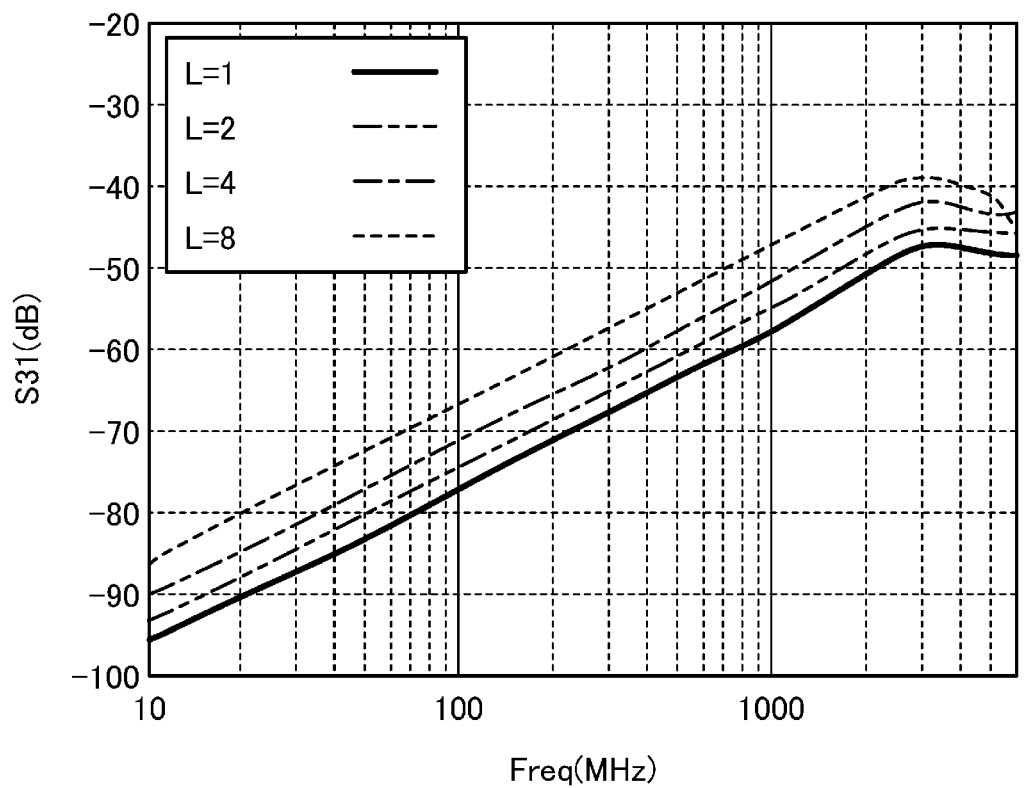
FIG. 24 is a graph illustrating simulation results obtained by using microstrip line models matched at 50Ω with an interlayer thickness of a substrate being 0.12 mm.
Figure 25:
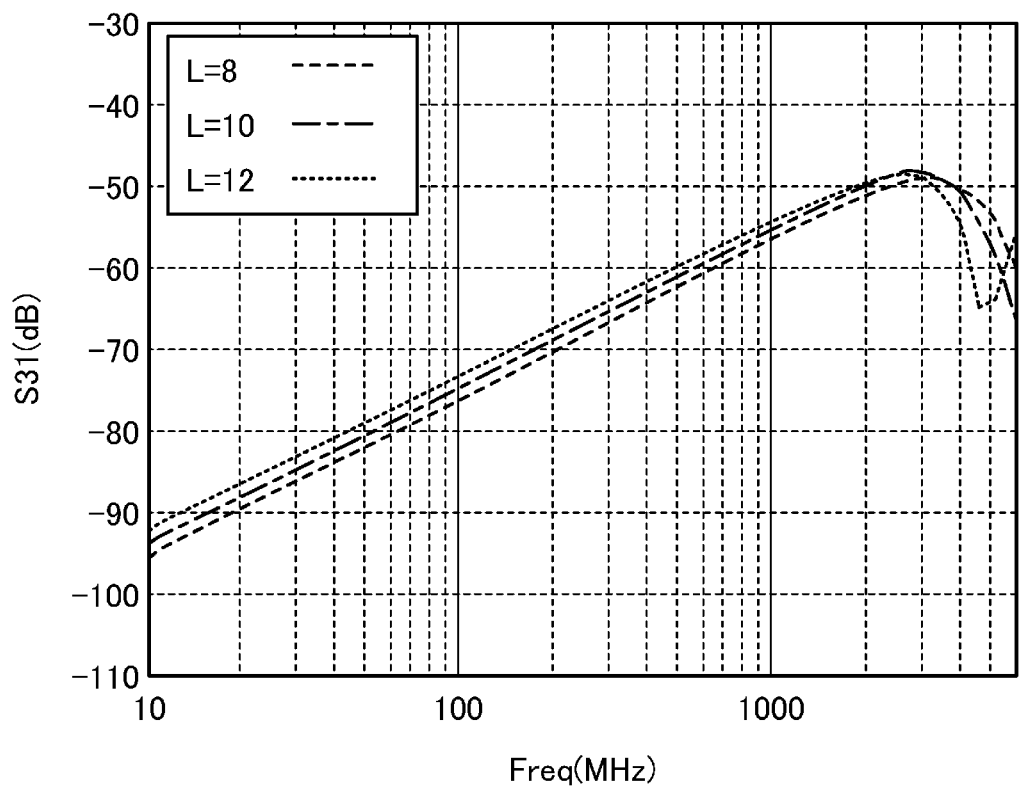
FIG. 25 is a graph illustrating simulation results obtained by using microstrip line models matched at 50Ω with an interlayer thickness of a substrate being 0.12 mm.
Figure 26:
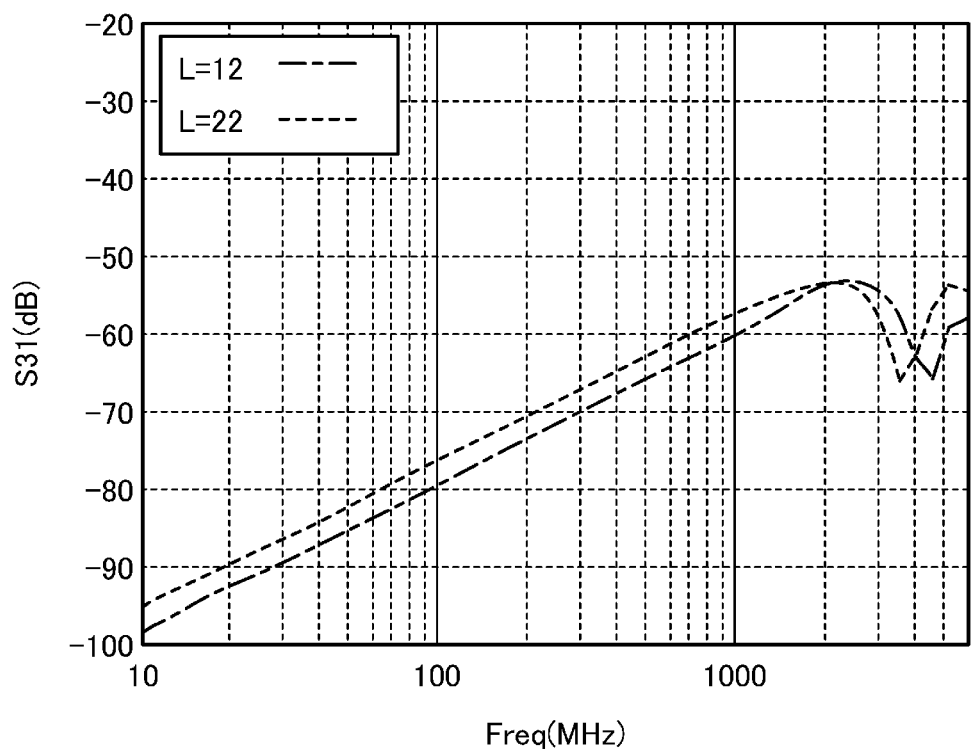
FIG. 26 is a graph illustrating simulation results obtained by using microstrip line models matched at 50Ω with an interlayer thickness of a substrate being 0.15 mm.

FIGS. 24 to 26 are graphs illustrating simulation results obtained by using microstrip line models matched at 50Ω with an interlayer thickness of the substrate 50' being mm. An assumed substrate is a 12-layer substrate having a substrate thickness of 1.5 mm or a 6-layer substrate having a substrate thickness of 0.8 mm. FIG. 24 illustrates a case in which the distance D=1 mm. FIG. 25 illustrates a case in which the distance D=2 mm. FIG. 26 illustrates a case in which the distance D=3 mm.

FIG. 27 is a table illustrating a relationship between the distance D between wirings and the parallel length L in wiring design for suppressing cross talk. As illustrated in FIG. 10, if the inductors 13A and 13B to which the conductors 15A and 15B are added are used, cross talk is suppressed by about 10 dB. If a threshold of cross talk is set to less than or equal to −45 dB at a frequency of 1 GHz, it is necessary to comply with the criteria illustrated in FIG. 27.

In FIG. 27, "with conductors" indicates a case in which conductors are provided, and "without conductors" indicates a case in which no conductors are provided. If the interlayer thickness of the wiring board is 0.25 mm, the width (wiring width) of the wirings 40A and 40B is preferably greater than or equal to 0.35 mm and less than or equal to 0.5 mm (i.e., from 0.35 mm to 0.5 mm). In this case, if the distance D between the wirings is 2 mm, the parallel length L is preferably N/A in a case of "without conductors" and is preferably less than or equal to 12 mm in a case of "with conductors". In addition, if the distance D between the wirings is 3 mm, the parallel length L is preferably less than or equal to 4 mm in a case of "without conductors" and is preferably less than or equal to 20 mm in a case of "with conductors". If the distance D between the wirings is 4 mm, the parallel length L may be less than or equal to 10 mm in a case of "without conductors" and may be greater than or equal to 20 mm in a case of "with conductors" (* in the figure).

On the other hand, if the interlayer thickness of the wiring board is 0.12 mm, the width (wiring width) of the wirings 40A and 40B is preferably greater than or equal to 0.1 mm and less than or equal to 0.2 mm (i.e., from 0.1 m to 0.2 mm). In this case, if the distance D between the wirings is 1 mm, the parallel length L is preferably less than or equal to 2 mm in a case of "without conductors" and is preferably less than or equal to 10 mm in a case of "with conductors". In addition, if the distance D between the wirings is 2 mm, the parallel length L may be less than or equal to 8 mm in a case of "without conductors" and may be greater than or equal to 20 mm in a case of "with conductors" (* in the figure). If the distance D between the wirings is 3 mm, the parallel length L may be greater than or equal to 20 mm in a case of "without conductors" and in a case of "with conductors" (* in the figure).

Here, cases of "without conductors" and cases of "with conductors" in FIG. 27 are compared with each other. It is found that a limit value in designing the wiring board is relieved in cases of "with conductors" which are cases of the circuit module according to the present disclosure. As described above, according to the circuit module according to the present disclosure, a design layout with a high degree of freedom can be achieved. Accordingly, it is possible to minimize deterioration of the quality of the transmission signal and optimize the mounting area.

Fourth Embodiment

Figure 28:
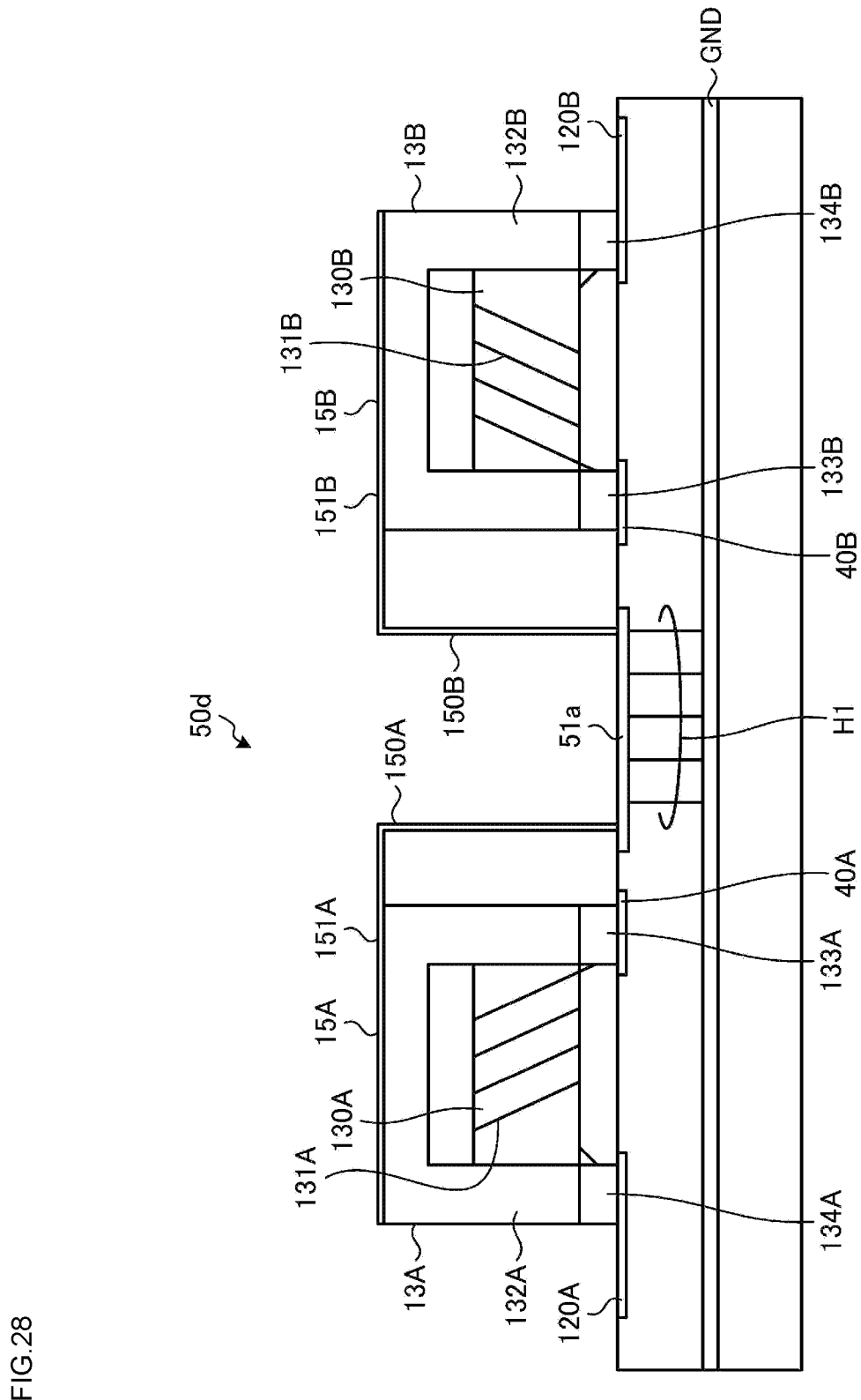
FIG. 28 is a diagram illustrating a configuration of a main portion of a circuit module according to a fourth embodiment.

FIG. 28 is a diagram illustrating a configuration of a main portion of a circuit module according to a fourth embodiment. FIG. 28 illustrates a cross section of the inductors 13A and 13B and the like taken at the same position as in FIG. 6 on a substrate 50d which is the main portion of the circuit module. As illustrated in FIG. 28, the conductor 15A is provided for the inductor 13A. As illustrated in FIG. 28, the conductor 15A has the side surface portion 150A and the upper surface portion 151A, and is bent in an L-shape. The upper surface portion 151A is provided on an upper surface of the housing 132A. An end of the side surface portion 150A is electrically connected to the guard pattern 51a.

In addition, as illustrated in FIG. 28, the conductor 15B is provided for the inductor 13B. As illustrated in FIG. 28, the conductor 15B has the side surface portion 150B and the upper surface portion 151B, and is bent in an L-shape. The upper surface portion 151B is provided on an upper surface of the housing 132B. An end of the side surface portion 150B is electrically connected to the guard pattern 51a.

The guard pattern 51a is electrically connected to the ground layer GND by the through hole H1. Therefore, after an electric field generated by the wiring 40A or 40B is capacitively coupled to the conductor 15A or 15B, a current flows toward the ground layer GND. Accordingly, the cross talk suppression effect can be enhanced.

Fifth Embodiment

Figure 29:
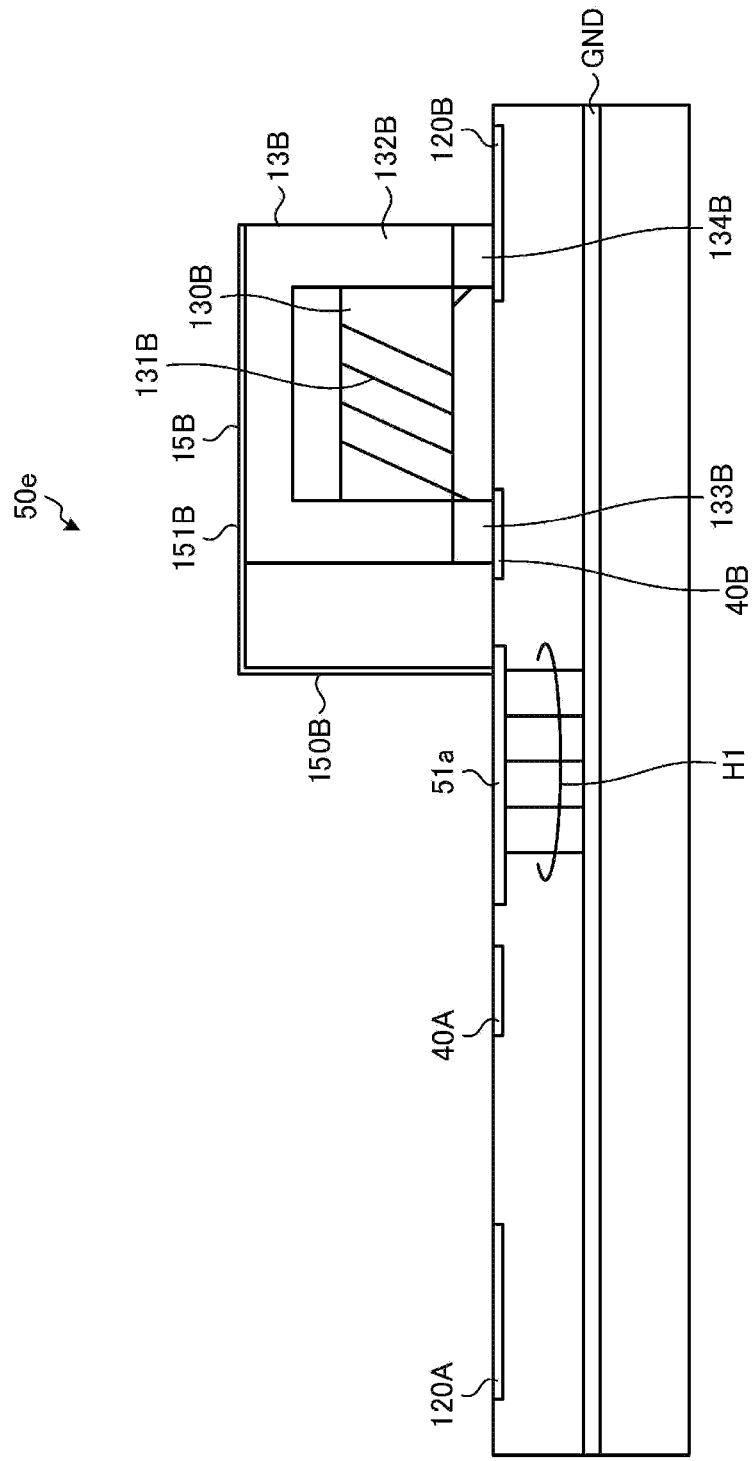
FIG. 29 is a diagram illustrating a configuration of a main portion of a circuit module according to a fifth embodiment.

FIG. 29 is a diagram illustrating a configuration of a main portion of a circuit module according to a fifth embodiment. FIG. 29 illustrates a cross section of the inductor 13B and the like taken at the same position as in FIG. 6 on a substrate 50e which is the main portion of the circuit module. The fifth embodiment has a configuration in which the inductor 13A of the fourth embodiment is omitted. As in the fourth embodiment, an end of the side surface portion 150B is electrically connected to the guard pattern 51a. Therefore, after an electric field generated by the wiring 40A is capacitively coupled to the conductor 15B, a current flows toward the ground layer GND. Accordingly, the cross talk suppression effect can be enhanced.

Sixth Embodiment

Figure 30:
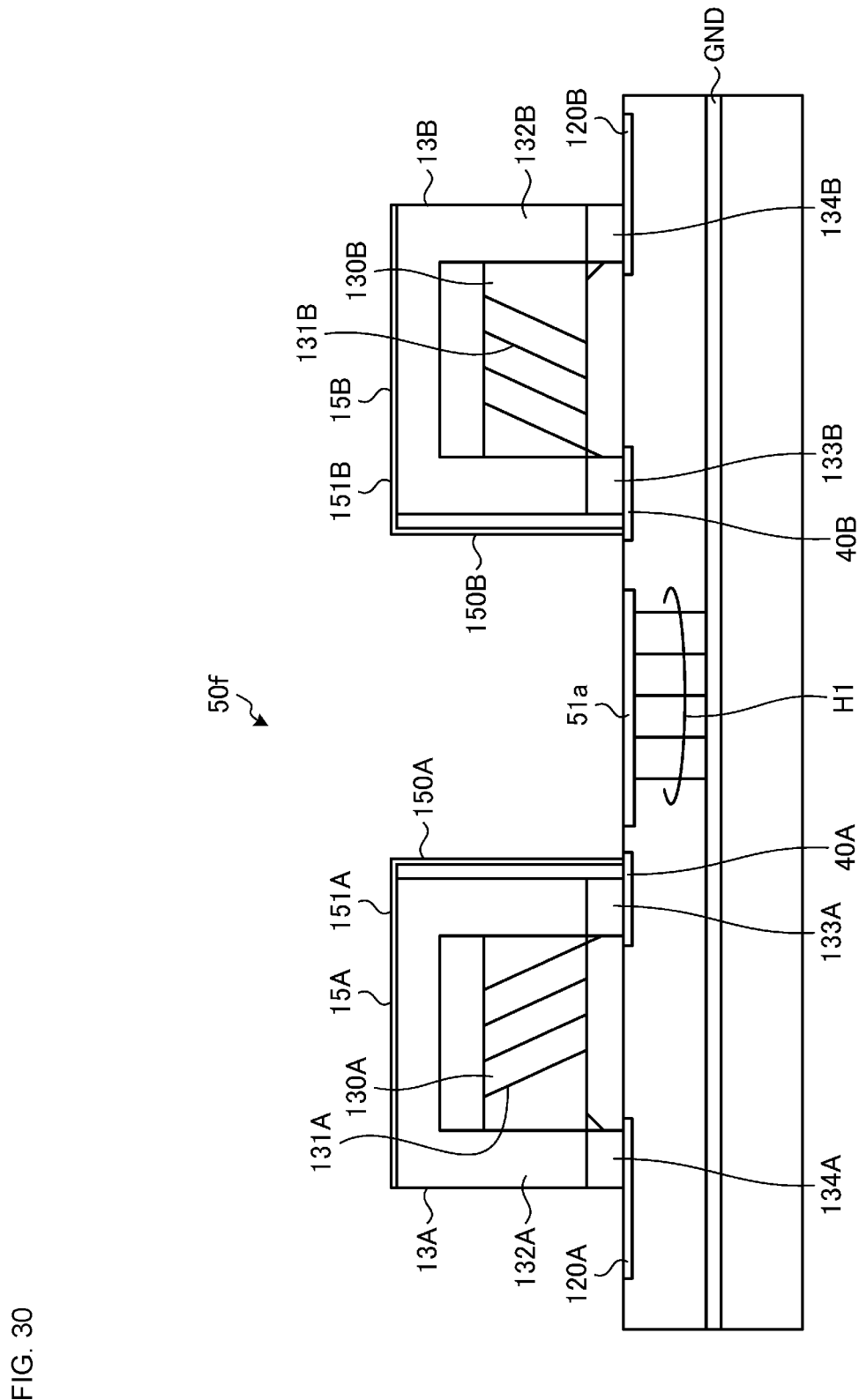
FIG. 30 is a diagram illustrating a configuration of a main portion of a circuit module according to a sixth embodiment.

FIG. 30 is a diagram illustrating a configuration of a main portion of a circuit module according to a sixth embodiment. FIG. 30 illustrates a cross section of the inductors 13A and 13B and the like taken at the same position as in FIG. 6 on a substrate 50f which is the main portion of the circuit module. In the sixth embodiment, the sheet-like conductors 15A and 15B are electrically connected to the wirings 40A and 40B.

As illustrated in FIG. 30, an end of the side surface portion 150A of the conductor 15A is electrically connected to the wiring 40A. An end of the side surface portion 150B of the conductor 15B is electrically connected to the wiring 40B. By such connection, the size of the entire inductors including the sheet-like conductors can be reduced as compared with a case of the fourth embodiment. Accordingly, the sixth embodiment can contribute to space saving.

By connecting the conductors 15A and 15B to the wirings 40A and 40B, which are transmission lines of signals to be transmitted, high-frequency components of signals on the wirings 40A and 40B are capacitively coupled to the conductors 15A and 15B. This capacitive coupling makes it easy for a current to flow from the conductors 15A and 15B to the ground layer GND. Accordingly, cross talk can be suppressed.

If the wirings 40A and 40B are power supply lines for supplying power, since the impedance on the power supply side is low, an effect similar to that obtained in a state in which the wirings 40A and 40B are connected to the ground layer GND is obtained.

Seventh Embodiment

Figure 31:
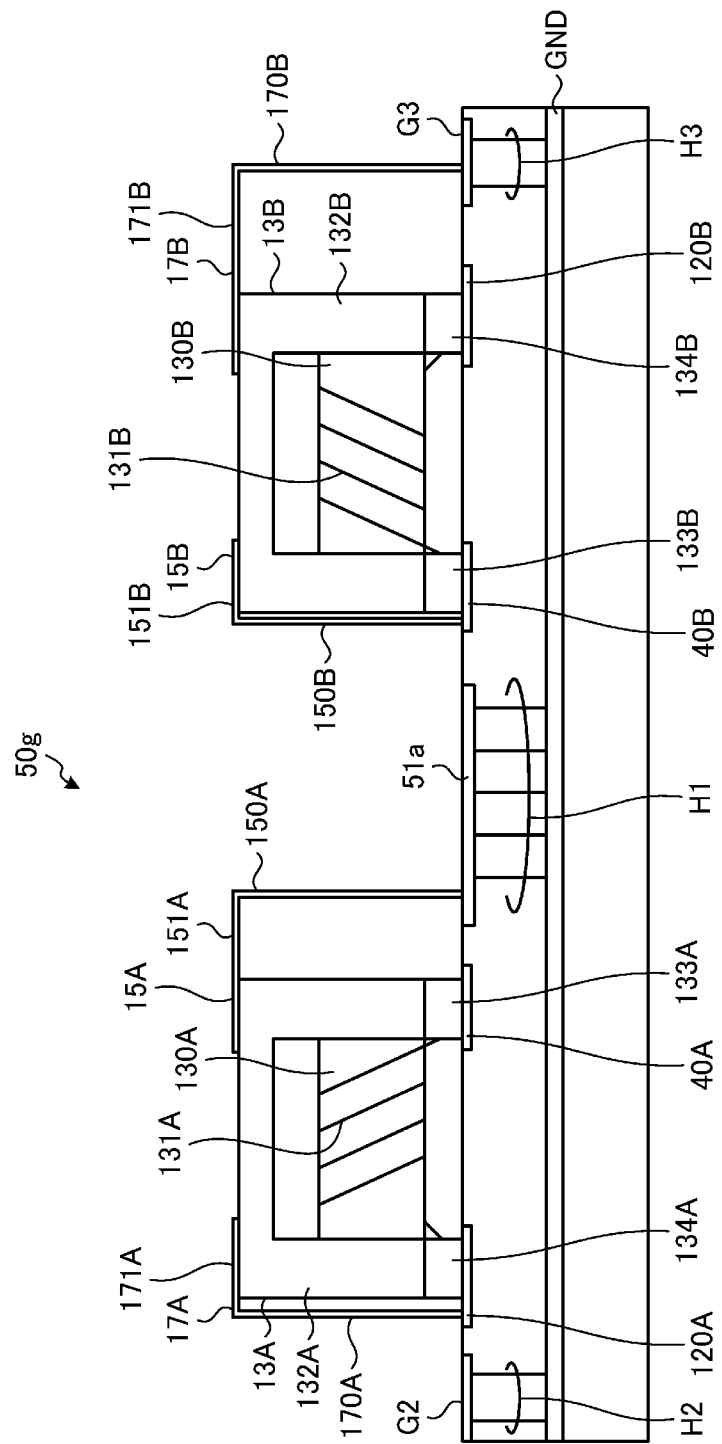
FIG. 31 is a diagram illustrating a configuration of a main portion of a circuit module according to a seventh embodiment.

FIG. 31 is a diagram illustrating a configuration of a main portion of a circuit module according to a seventh embodiment. FIG. 31 illustrates a cross section of the inductors 13A and 13B and the like taken at the same position as in FIG. 6 on a substrate 50g which is the main portion of the circuit module. In the seventh embodiment, a plurality of sheet-like conductors are provided for one inductor. That is, the conductor 15A and a conductor 17A are provided for the inductor 13A. The conductor 15A has the side surface portion 150A and the upper surface portion 151A. An end of the side surface portion 150A is connected to the guard pattern 51a. The sheet-like conductor 17A has a side surface portion 170A and an upper surface portion 171A. An end of the side surface portion 170A is connected to the power supply pattern 120A. The conductors 15A and 17A are electrically isolated from each other, and the insulating state between the power supply pattern 120A and the ground layer GND is maintained.

Note that in FIG. 31, a ground electrode G2 is electrically connected to the ground layer GND by a through hole H2. A ground electrode G3 is electrically connected to the ground layer GND by a through hole H3.

In addition, the sheet-like conductor 15B and a sheet-like conductor 17B are provided for the inductor 13B. The conductor 15B has the side surface portion 150B and the upper surface portion 151B. One end of the side surface portion 150B is connected to the wiring 40B. The conductor 17B has a side surface portion 170B and an upper surface portion 171B. One end of the side surface portion 170B is connected to the ground electrode G3. The conductors 15B and 17B are electrically isolated from each other, and the insulating state between the wiring 40B and the ground layer GND is maintained.

According to the configuration illustrated in FIG. 31, both the effect of the fourth embodiment and the effect of the sixth embodiment can be obtained.

Eighth Embodiment

Figure 32:
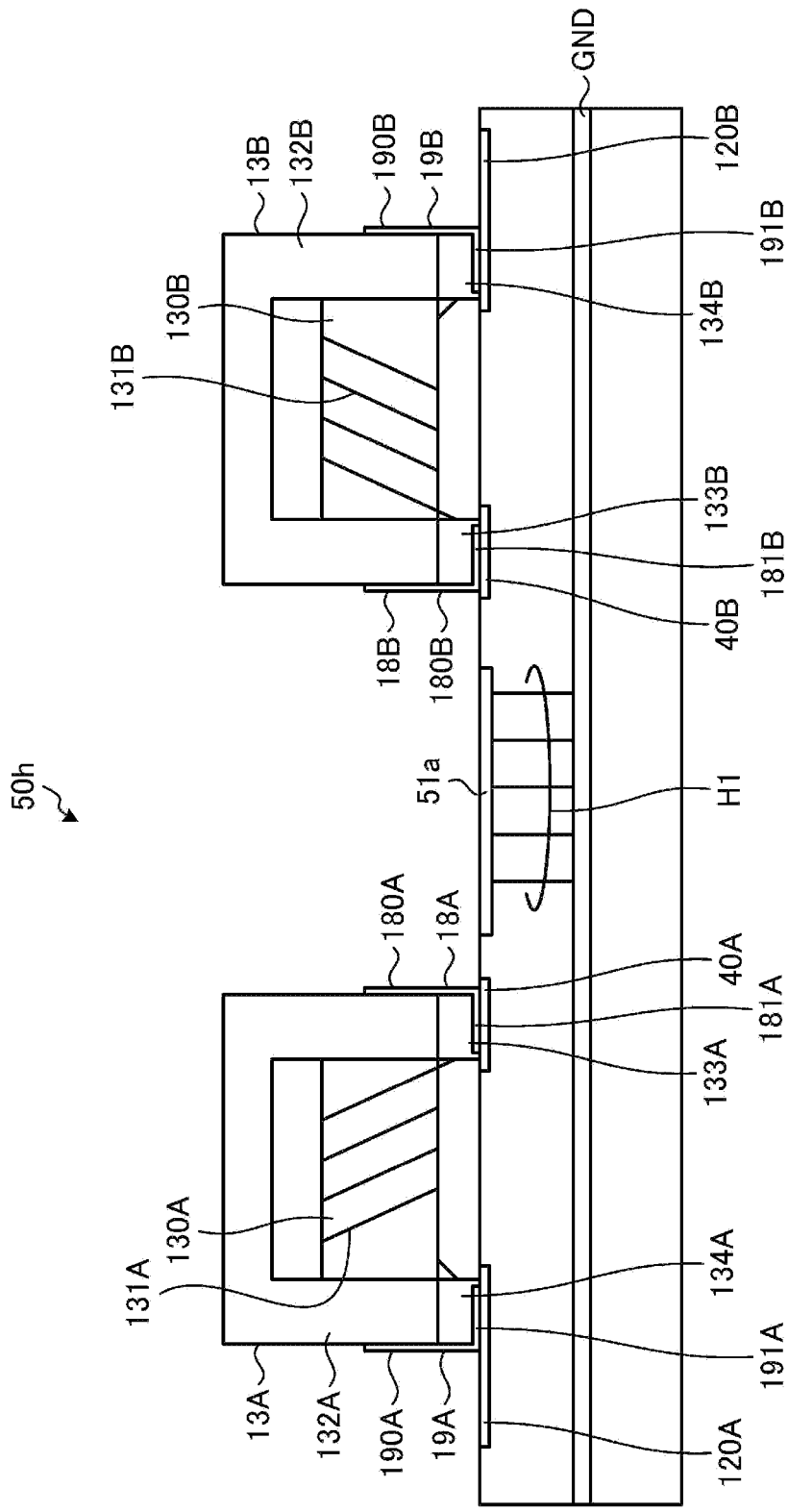
FIG. 32 is a diagram illustrating a configuration of a main portion of a circuit module according to an eighth embodiment.

FIG. 32 is a diagram illustrating a configuration of a main portion of a circuit module according to an eighth embodiment. FIG. 32 illustrates a cross section of the inductors 13A and 13B and the like taken at the same position as in FIG. 6 on a substrate 50h which is the main portion of the circuit module. In the eighth embodiment, a sheet-like conductor is provided for each of electrodes of the inductors 13A and 13B. That is, as illustrated in FIG. 32, a conductor 18A is connected to the terminal 133A of the inductor 13A. The conductor 18A has a side surface portion 180A and a lower surface portion 181A. The terminal 133A is electrically connected to the wiring 40A via the lower surface portion 181A. The side surface portion 180A extends in the height direction of the terminal 133A (to be away from the wiring 40A).

In addition, a sheet-like conductor 19A is connected to the terminal 134A of the inductor 13A. The conductor 19A has a side surface portion 190A and a lower surface portion 191A. The terminal 134A is electrically connected to the power supply pattern 120A via the lower surface portion 191A. The side surface portion 190A extends in the height direction of the terminal 134A (to be away from the power supply pattern 120A).

Furthermore, a sheet-like conductor 18B is connected to the terminal 133B of the inductor 13B. The conductor 18B has a side surface portion 180B and a lower surface portion 181B. The terminal 133B is electrically connected to the wiring 40B via the lower surface portion 181B. The side surface portion 180B extends in the height direction of the terminal 133B (to be away from the wiring 40B).

In addition, a sheet-like conductor 19B is connected to the terminal 134B of the inductor 13B. The conductor 19B has a side surface portion 190B and a lower surface portion 191B. The terminal 134B is electrically connected to the power supply pattern 120B via the lower surface portion 191B. The side surface portion 190B extends in the height direction of the terminal 134B (to be away from the power supply pattern 120B).

As illustrated in FIG. 32, crosstalk can be suppressed by providing the conductors 18A, 19A, 18B, and 19B having portions extending in the height direction of the electrodes of the inductors 13A and 13B.

Ninth Embodiment

Figure 33:
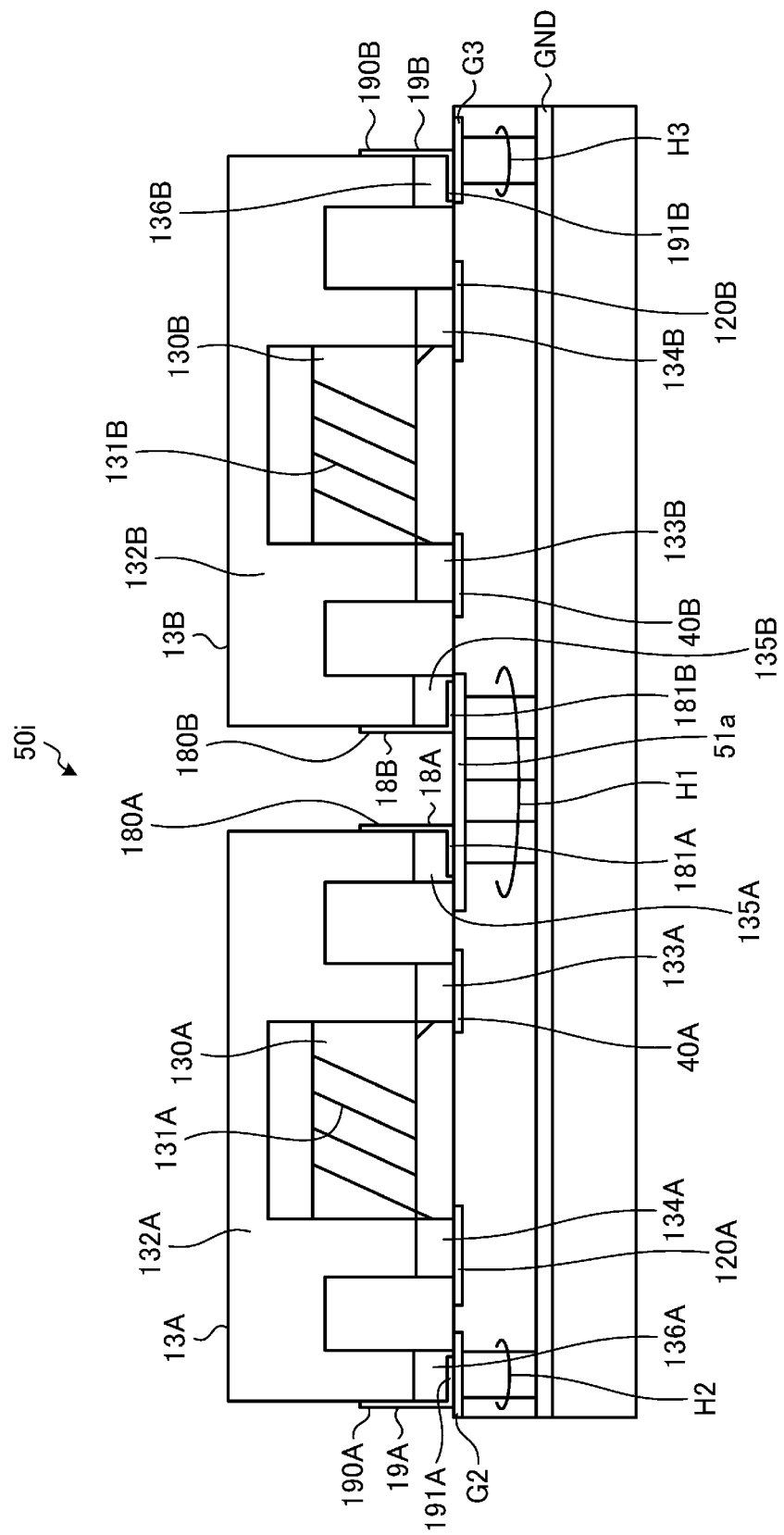
FIG. 33 is a diagram illustrating a configuration of a main portion of a circuit module according to a ninth embodiment.
Figure 34:
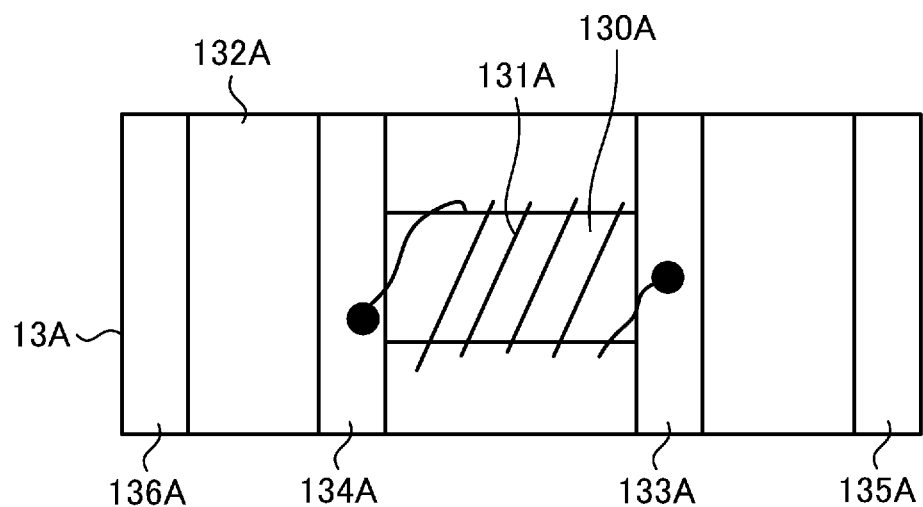
FIG. 34 is a view of an inductor illustrated in FIG. 33 viewed from below.

FIG. 33 is a diagram illustrating a configuration of a main portion of a circuit module according to a ninth embodiment. FIG. 33 illustrates a cross section of the inductors 13A and 13B and the like taken at the same position as in FIG. 6 on a substrate 50i which is the main portion of the circuit module. FIG. 34 is a view of the inductor 13A illustrated in FIG. 33 viewed from below. In the ninth embodiment, the inductors 13A and 13B have a plurality of terminals, and at least one of the terminals is an open terminal that is not connected to a wound wire.

In FIG. 33, the terminal 133A is electrically connected to the wiring 40A. The terminal 134A is electrically connected to the power supply pattern 120A. The terminal 133B is electrically connected to the wiring 40B. The terminal 134B is electrically connected to the power supply pattern 120B.

In addition, in FIGS. 33 and 34, the housing 132A of the inductor 13A has the terminals 133A and 134A and terminals 135A and 136A. One end of the wound wire 131A is electrically connected to the terminal 133A. The other end of the wound wire 131A is electrically connected to the terminal 134A. The terminals 135A and 136A are open terminals that are not connected to the wound wire 131A. The terminal 135A is electrically connected to the guard pattern 51a via the lower surface portion 181A. The terminal 136A is electrically connected to the ground electrode G2 via the lower surface portion 191A.

Similarly, the housing 132B of the inductor 13B has the terminals 133B and 134B and terminals 135B and 136B. One end of the wound wire 131B is electrically connected to the terminal 133B. The other end of the wound wire 131B is electrically connected to the terminal 134B. The terminals 135B and 136B are open terminals that are not connected to the wound wire 131B. The terminal 135B is electrically connected to the guard pattern 51a via the lower surface portion 181B. The terminal 136B is electrically connected to the ground electrode G3 via the lower surface portion 191B.

Tenth Embodiment

Figure 35:
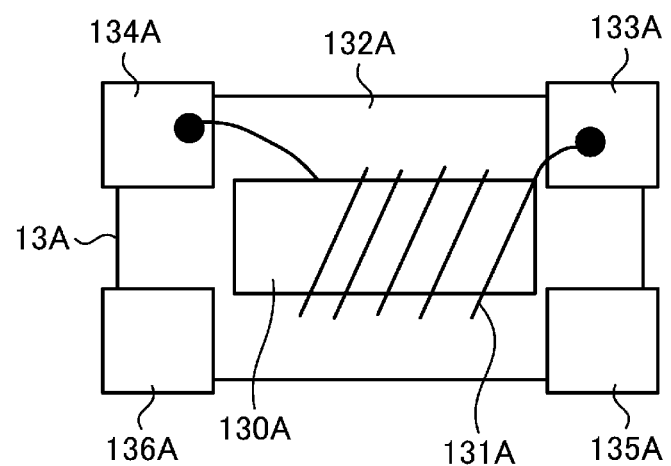
FIG. 35 is a view of an inductor used in a circuit module according to a tenth embodiment viewed from below.

FIG. 35 is a view of the inductor 13A used in a circuit module according to a tenth embodiment viewed from below. If the inductor 13A has a plurality of terminals, the arrangement of the terminals is not limited to the arrangement illustrated in FIGS. 33 and 34, and may be the arrangement illustrated in FIG. 35. That is, the inductor 13A having open terminals illustrated in FIG. 35 may be used depending on the arrangement of the wiring 40A, the guard pattern 51a, the power supply pattern 120A, and the like.

In the inductor 13A illustrated in FIG. 35, one end of the wound wire 131A is electrically connected to the terminal 133A. The other end of the wound wire 131A is electrically connected to the terminal 134A. The terminals 135A and 136A are open terminals that are not connected to the wound wire 131A. The inductor 13A is mounted on the substrate by the terminals 133A, 134A, 135A, and 136A.

FIG. 36 is a table illustrating conditions of a wiring board used in each of the embodiments described above. As illustrated in FIG. 36, if the interlayer thickness of the wiring board is 0.25 mm, the width (wiring width) of the wirings 40A and 40B is preferably greater than or equal to 0.35 mm and less than or equal to 0.5 mm (i.e., from 0.35 mm to 0.5 mm). In this case, if the distance D between the wirings is 2 mm, the parallel length L is preferably less than or equal to 12 mm. In addition, if the distance D between the wirings is 3 mm, the parallel length L is preferably less than or equal to 20 mm. Note that an interlayer thickness of the wiring board being 0.25 mm assumes a 6-layer substrate having a thickness 1.5 mm or a 4-layer substrate having a thickness 0.8 mm.

On the other hand, if the interlayer thickness of the wiring board is 0.12 mm, the width (wiring width) of the wirings 40A and 40B is preferably greater than or equal to 0.1 mm and less than or equal to 0.2 mm (i.e., from 0.1 mm to 0.2 mm), the distance D between the wirings is preferably 1 mm, and the parallel length L is preferably less than or equal to 10 mm. Note that an interlayer thickness of the wiring board being 0.12 mm assumes a 12-layer substrate having a thickness 1.5 mm or a 6-layer substrate having a thickness 0.8 mm. By mounting the inductors 13A and 13B using the wiring board that satisfies the conditions illustrated in FIG. 36, cross talk can be suppressed to a generally required level.

Eleventh Embodiment

Figure 37:
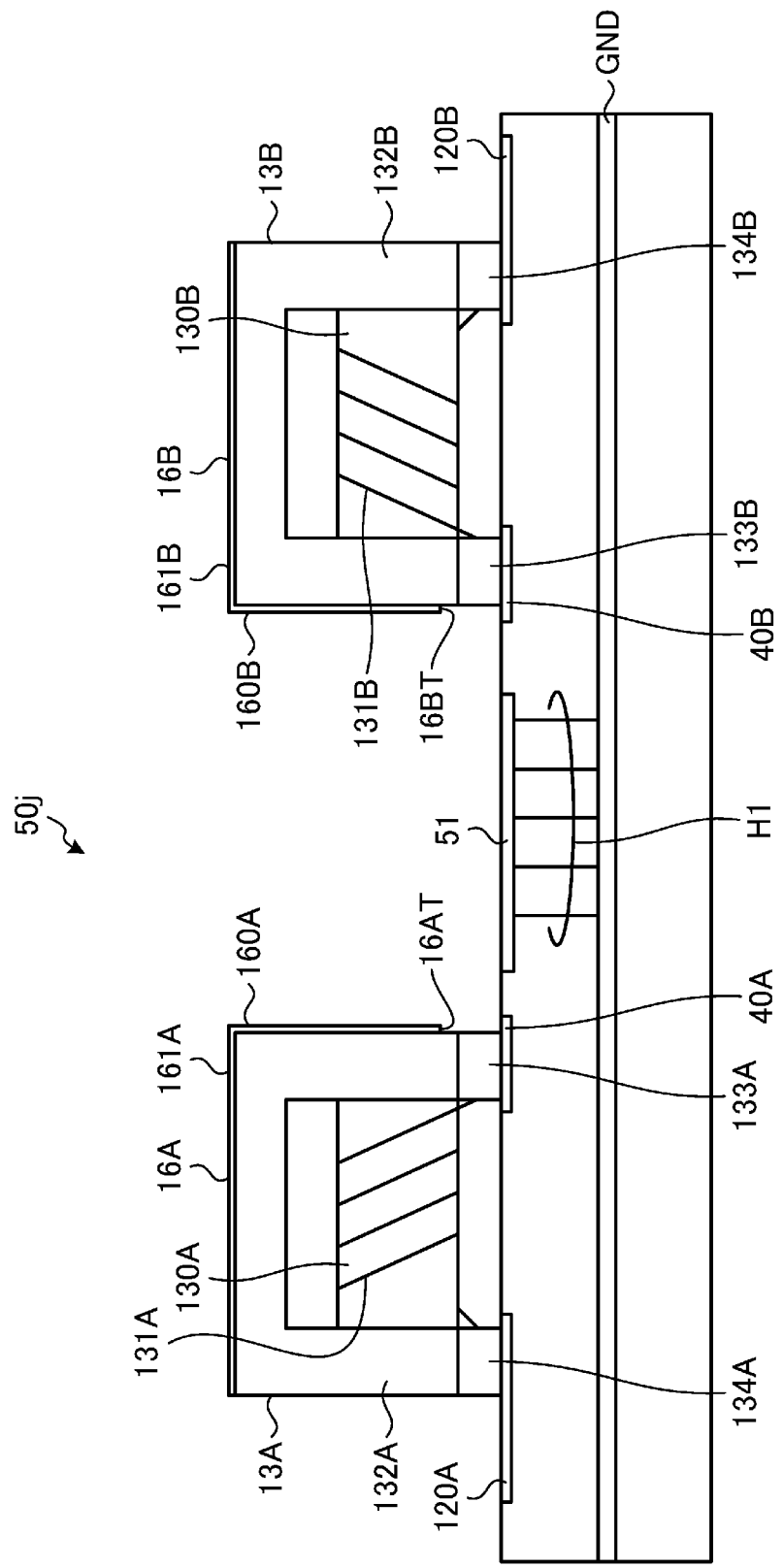
FIG. 37 is a diagram illustrating a configuration of a main portion of a circuit module according to an eleventh embodiment.

FIG. 37 is a diagram illustrating a configuration of a main portion of a circuit module according to an eleventh embodiment. FIG. 37 illustrates a cross section of the inductors 13A and 13B and the like taken at the same position as in FIG. 6 on a substrate 50j which is the main portion of the circuit module. In the eleventh embodiment, conductors 16A and 16B formed by vapor deposition or plating are included. The conductor 16A is formed along surfaces of the housing of the inductor 13A. The conductor 16B is formed along surfaces of the housing of the inductor 13B.

The conductor 16A has an upper surface portion 161A formed on an upper surface of the housing of the inductor 13A and a side surface portion 160A formed on a side surface of the housing of the inductor 13A. The upper surface portion 161A and the side surface portion 160A are continuous with each other and electrically connected to each other. An end portion 16AT of the side surface portion 160A in the present example is not connected to the terminal 133A. The side surface portion 160A extends in the height direction of the terminal 133A (to be away from the wiring 40A).

The conductor 16B has an upper surface portion 161B formed on an upper surface of the housing of the inductor 13B and a side surface portion 160B formed on a side surface of the housing of the inductor 13B. The upper surface portion 161B and the side surface portion 160B are continuous with each other and electrically connected to each other. An end portion 16BT of the side surface portion 160B in the present example is not connected to the terminal 133B. The side surface portion 160B extends in the height direction of the terminal 133B (to be away from the wiring 40B). The side surface portion 160A and the side surface portion 160B face each other. Also in the circuit module according to the eleventh embodiment, it is possible to suppress cross talk and to secure performance for implementing PoC.

Twelfth Embodiment

Figure 38:
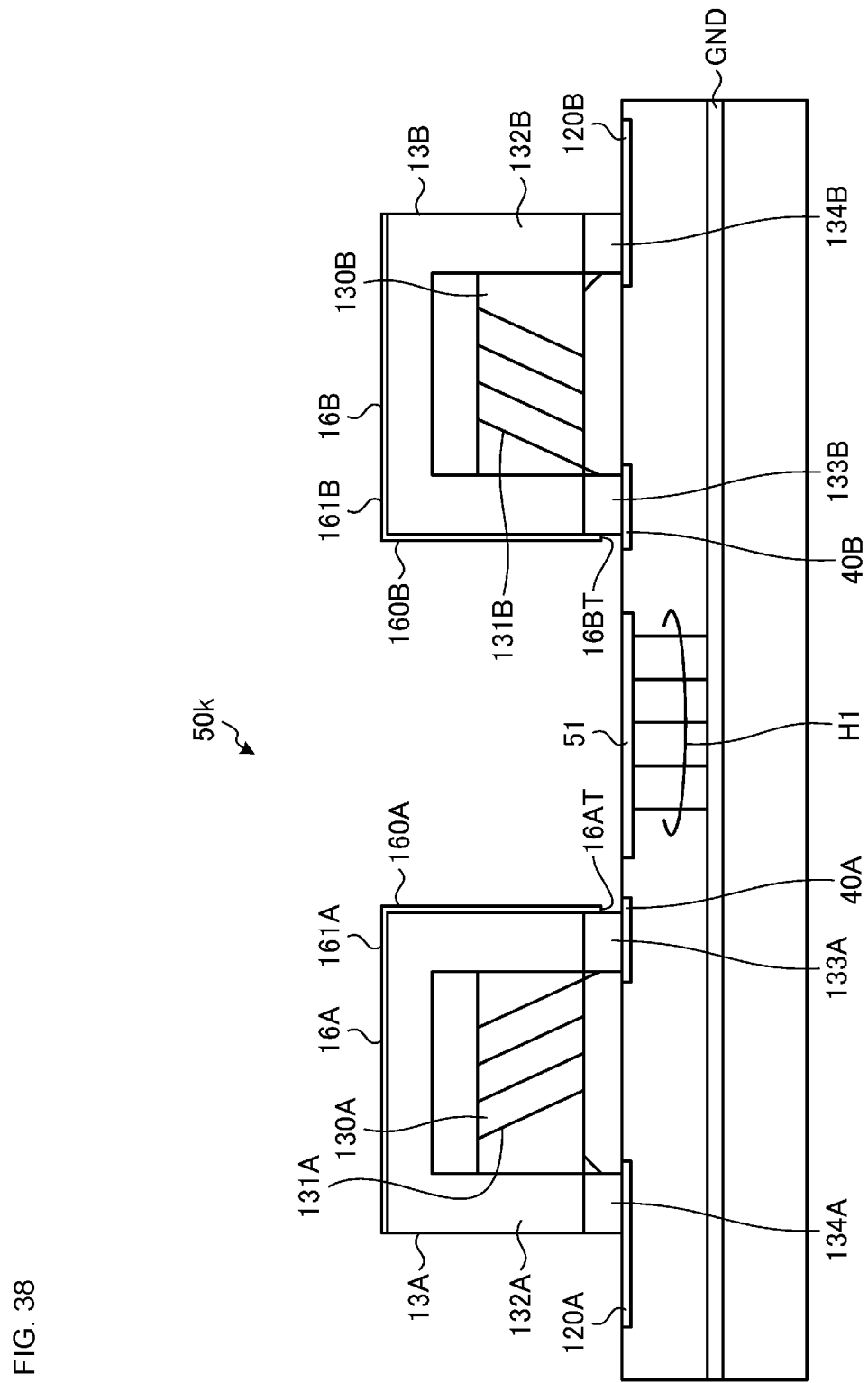
FIG. 38 is a diagram illustrating a configuration of a main portion of a circuit module according to a twelfth embodiment.

FIG. 38 is a diagram illustrating a configuration of a main portion of a circuit module according to a twelfth embodiment. FIG. 38 illustrates a cross section of the inductors 13A and 13B and the like taken at the same position as in FIG. 6 on a substrate 50k which is the main portion of the circuit module. In the twelfth embodiment, the conductors 16A and 16B formed by vapor deposition or plating are included.

The circuit module according to the twelfth embodiment differs from the circuit module according to the eleventh embodiment in that the end portion 16AT of the side surface portion 160A is connected to the terminal 133A, and the end portion 16BT of the side surface portion 160B is connected to the terminal 133B. Thus, the conductor 16A is electrically connected to the wiring 40A via the terminal 133A. In addition, the conductor 16B is electrically connected to the wiring 40B via the terminal 133B. Also in the circuit module according to the twelfth embodiment, it is possible to suppress cross talk and to secure performance for implementing PoC.

Thirteenth Embodiment

Figure 39:
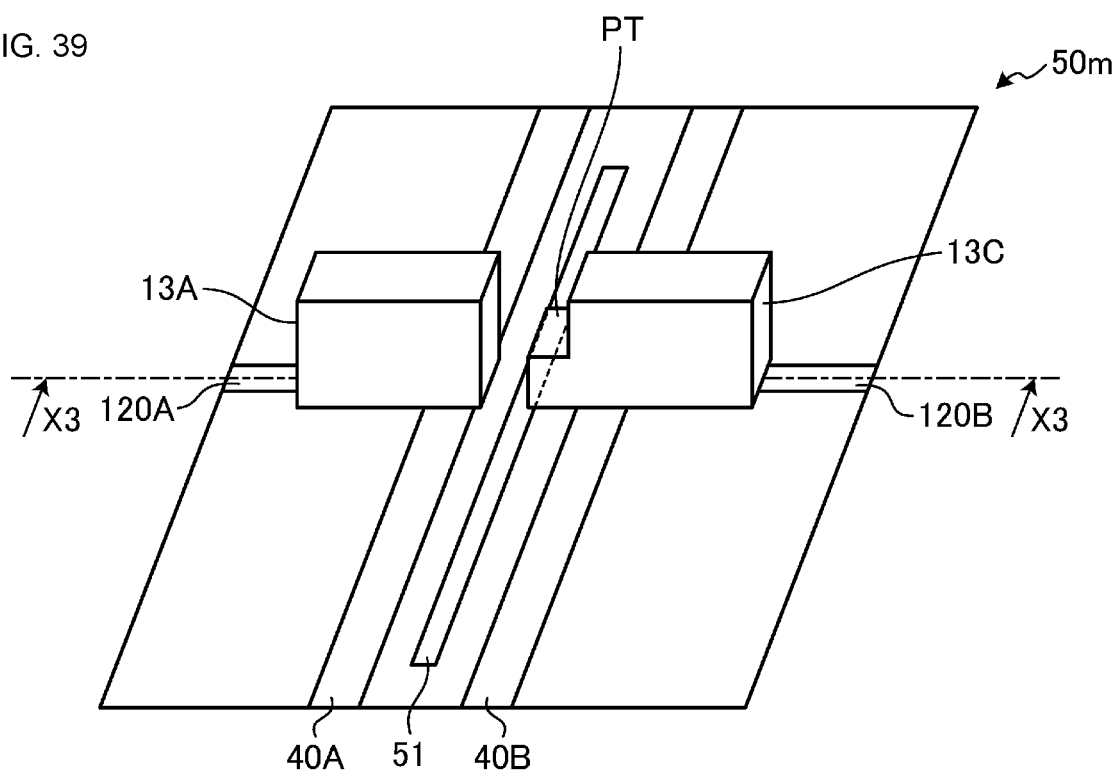
FIG. 39 is a diagram illustrating a configuration of a main portion of a circuit module according to a thirteenth embodiment.
Figure 40:
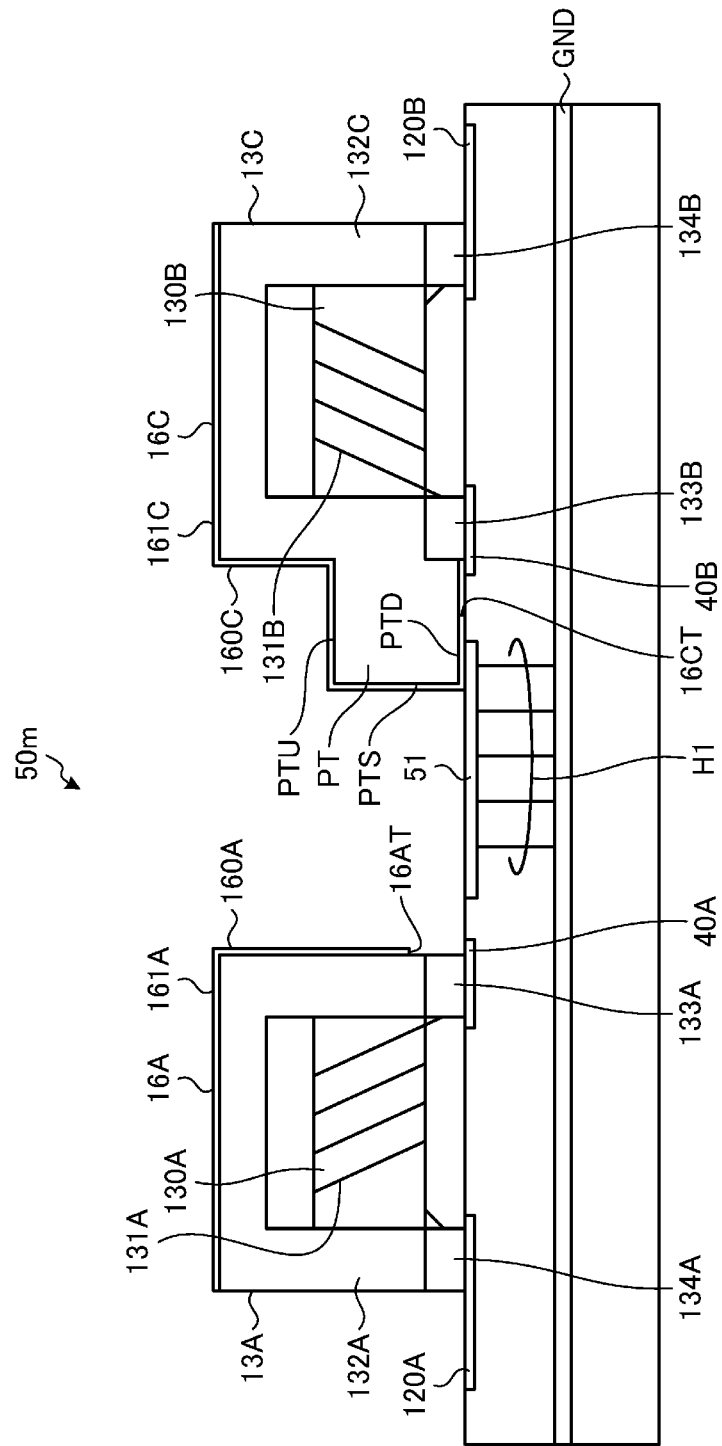
FIG. 40 is a cross-sectional view taken along line X3-X3 in FIG. 39.

FIG. 39 is a diagram illustrating a configuration of a main portion of a circuit module according to a thirteenth embodiment. FIG. 40 is a cross-sectional view taken along line X3-X3 in FIG. 39. FIG. 39 is a cross-sectional view of the inductors 13A and 13C including a substrate 50m. The present disclosure addresses strict cross talk requirements by focusing on the PoC circuits and using a particular configuration of the inductors used in the PoC circuits.

The inductor 13A illustrated in FIG. 39 has the same configuration as the inductor 13A of the eleventh embodiment described with reference to FIG. 37. In the thirteenth embodiment, the conductor 16A and a conductor 16C formed by vapor deposition or plating are included. The conductor 16A is substantially the same as that in the circuit module according to the eleventh embodiment. The inductor 13C illustrated in FIG. 39 differs from the inductor 13A in the shape of the housing. The housing of the inductor 13C has a protrusion PT. The protrusion PT protrudes from a side surface portion of the inductor 13C toward the inductor 13A. The protrusion PT in the present example is a rectangular parallelepiped. In the present example, the length of the protrusion PT in the direction along the guard pattern 51 is equal to the length of the housing of the inductor 13C in the direction along the guard pattern 51. The inductor 13C is mounted on a surface of the substrate 50m such that the protrusion PT faces the inductor 13A.

The conductor 16C formed on a surface of the inductor 13C has an upper surface portion 161C and a side surface portion 160C. The upper surface portion 161C and the side surface portion 160C are continuous with each other and electrically connected to each other. The side surface portion 160C is formed along the shape of surfaces of the protrusion PT. That is, the side surface portion 160C is formed continuously with an upper surface PTU and a side surface PTS of the protrusion PT, and is also formed on part of a bottom surface PTD. An end portion 16CT of the side surface portion 160C is located on the bottom surface PTD. The conductor 16C and the guard pattern 51 are electrically connected to each other on the bottom surface PTD. By using the inductor 13C having the protrusion PT, it is possible to implement good electrical connection between the conductor 16C and the guard pattern 51. The guard pattern 51 is electrically connected to the ground layer GND by the through hole H1. Thus, the conductor 16C is electrically connected to the ground layer GND. Accordingly, it is possible to suppress cross talk and to secure performance for implementing PoC.

Note that the shape of the protrusion PT is not limited to a rectangular parallelepiped as illustrated in FIG. 39. The shape of the protrusion PT may be any shape as long as the conductor 16C formed on the surfaces of the protrusion PT can be electrically connected to the guard pattern 51. Instead of the inductor 13A, an inductor having the protrusion PT like the inductor 13C may be used. In this case, both inductors facing each other with the guard pattern 51 interposed therebetween have the protrusion PT.

With regard to the claims, the present disclosure may take the following aspects.

<1> A circuit module including: a wiring board; a first line provided on the wiring board, the first line being provided for transmitting a signal to be transmitted to a first circuit and a power supply voltage for supplying power to the first circuit, the first circuit being provided outside the wiring board; a second line provided on the wiring board side by side with the first line, the second line being provided for transmitting a signal to be transmitted to a second circuit and a power supply voltage for supplying power to the second circuit, the second circuit being provided outside the wiring board independently of the first circuit; a first inductor provided on the wiring board, having one end connected to the first line, and having another end connected to a power supply circuit for supplying the power; and a sheet-like first conductor provided on or near at least part of a side surface of a housing that holds the first inductor, the side surface being close to the second line.

<2> The circuit module according to <1>, in which the first conductor has a portion that covers an upper surface of the housing that holds the first inductor.

<3> The circuit module according to <1> or <2>, further including: a second inductor provided on the wiring board, having one end connected to the second line, and having another end connected to a power supply circuit for supplying power; and a sheet-like second conductor provided on or near at least part of a side surface of the second inductor, the side surface being close to the first line.

<4> The circuit module according to <3>, in which the side surface of the first inductor, the side surface being close to the second line, and the side surface of the second inductor, the side surface being close to the first line, face each other.

<5> The circuit module according to <3>, in which the first inductor and the second inductor are provided at positions displaced from each other in a length direction of a parallel portion of the first line and the second line.

<6> The circuit module according to any one of <1> to <5>, in which the first conductor is electrically connected to a ground potential.

<7> The circuit module according to any one of <1> to <5>, in which the first conductor is connected to the first line.

<8> The circuit module according to any one of <3> to <5>, in which the second conductor is electrically connected to a ground potential.

<9> The circuit module according to any one of <3> to <5>, in which the second conductor is connected to the second line.

<10> The circuit module according to any one of <1> to <9>, further including a guard pattern provided between the first line and the second line and electrically connected to a ground potential.

What is claimed is:

1. A circuit module comprising:
    a wiring board;
    a first line on the wiring board, the first line being configured to transmit a signal to a first circuit and a power supply voltage for supplying power to the first circuit, the first circuit being outside of the wiring board;
    a second line on the wiring board side by side with the first line, the second line being configured to transmit a signal to a second circuit and a power supply voltage for supplying power to the second circuit, the second circuit being outside of the wiring board independently of the first circuit;
    a first inductor on the wiring board, having one end connected to the first line, and having another end configured to connect to a power supply circuit for supplying the power;
    a first housing that holds the first inductor; and
    a sheet-like first conductor on or near at least part of a side surface of the first housing, the side surface facing toward the second line.

2. The circuit module according to claim 1, wherein the sheet-like first conductor has a portion that covers an upper surface of the first housing that holds the first inductor.

3. The circuit module according to claim 2, further comprising:
    a second inductor on the wiring board, having one end connected to the second line, and having another end configured to connect to a power supply circuit for supplying power;
    a second housing that holds the second inductor; and
    a sheet-like second conductor on or near at least part of a side surface of the second housing, the side surface facing toward the first line.

4. The circuit module according to claim 3, wherein the side surface of the first housing and the side surface of the second housing face each other.

5. The circuit module according to claim 3, wherein the first inductor and the second inductor are at positions displaced from each other in a length direction of a parallel portion of the first line and the second line.

6. The circuit module according to claim 3, wherein the sheet-like second conductor is configured to electrically connect to a ground potential.

7. The circuit module according to claim 3, wherein the sheet-like second conductor is connected to the second line.

8. The circuit module according to claim 2, wherein the sheet-like first conductor is configured to electrically connect to a ground potential.

9. The circuit module according to claim 2, wherein the sheet-like first conductor is connected to the first line.

10. The circuit module according to claim 2, further comprising:
    a guard pattern between the first line and the second line and configured to electrically connect to a ground potential.

11. The circuit module according to claim 1, further comprising:
    a second inductor on the wiring board, having one end connected to the second line, and having another end configured to connect to a power supply circuit for supplying power;
    a second housing that holds the second inductor; and
    a sheet-like second conductor on or near at least part of a side surface of the second housing, the side surface facing toward the first line.

12. The circuit module according to claim 11, wherein the side surface of the first housing and the side surface of the second housing face each other.

13. The circuit module according to claim 11, wherein the first inductor and the second inductor are at positions displaced from each other in a length direction of a parallel portion of the first line and the second line.

14. The circuit module according to claim 11, wherein the sheet-like second conductor is configured to electrically connect to a ground potential.

15. The circuit module according to claim 11, wherein the sheet-like second conductor is connected to the second line.

16. The circuit module according to claim 1, wherein the sheet-like first conductor is configured to electrically connect to a ground potential.

17. The circuit module according to claim 1, wherein the sheet-like first conductor is connected to the first line.

18. The circuit module according to claim 1, further comprising:
    a guard pattern between the first line and the second line and configured to electrically connect to a ground potential.

* * * * *